(12) United States Patent
Zeng

(10) Patent No.: US 11,665,948 B2
(45) Date of Patent: May 30, 2023

(54) DISPLAY PANEL AND DISPLAY DEVICE

(71) Applicant: Tianma Micro-Electronics Co., Ltd., Shenzhen (CN)

(72) Inventor: Yang Zeng, Shanghai (CN)

(73) Assignee: TIANMA MICRO-ELECTRONICS CO., LTD., Shenzhen (CN)

( * ) Notice: Subject to any disclaimer, the term of this patent is extended or adjusted under 35 U.S.C. 154(b) by 372 days.

(21) Appl. No.: 17/104,183

(22) Filed: Nov. 25, 2020

(65) Prior Publication Data

US 2022/0102439 A1 Mar. 31, 2022

(30) Foreign Application Priority Data

Sep. 30, 2020 (CN) .......................... 202011069124.7

(51) Int. Cl.
*H10K 59/35* (2023.01)
*H10K 50/86* (2023.01)
*H01L 27/32* (2006.01)
*H01L 51/52* (2006.01)

(52) U.S. Cl.
CPC ...... *H01L 27/3218* (2013.01); *H01L 27/3223* (2013.01); *H01L 51/5237* (2013.01); *H01L 51/5284* (2013.01); *H01L 51/5293* (2013.01)

(58) Field of Classification Search
CPC ............. H01L 27/3272; H01L 51/5281; H01L 51/5284
See application file for complete search history.

(56) References Cited

U.S. PATENT DOCUMENTS

2002/0093284 A1* 7/2002 Adachi ............... H01L 27/3211
313/506

FOREIGN PATENT DOCUMENTS

CN 106816455 A 6/2017
CN 109782964 A 5/2019

* cited by examiner

*Primary Examiner* — Daniel P Shook
(74) *Attorney, Agent, or Firm* — Anova Law Group PLLC

(57) ABSTRACT

A display panel includes a base substrate; and a light-emitting device layer, disposed on the base substrate and including sub-pixels. A sub-pixel includes light-emitting regions and a non-light-emitting regions located between adjacent light-emitting regions. The display panel includes a light-shielding layer, disposed on the side of the light-emitting device layer away from the base substrate and including a light-shielding structure located in the non-light-emitting region; and a polarizer, disposed on the side of the light-shielding layer away from the base substrate and having an absorption axis in a first direction. In each sub-pixel, along the first direction, the minimum distance between the boundary of the light-emitting region and the light-shielding structure is a first distance B; along a second direction intersected with the first direction, the minimum distance between the boundary of the light-emitting region and the light-shielding structure is a second distance A; and B>A.

20 Claims, 18 Drawing Sheets

DISPLAY PANEL AND DISPLAY DEVICE

CROSS-REFERENCES TO RELATED APPLICATIONS

This application claims the priority of Chinese patent application No. 202011069124.7, filed on Sep. 30, 2020, the entirety of which is incorporated herein by reference.

FIELD OF THE DISCLOSURE

The present disclosure generally relates to the field of display technology and, more particularly, relates to a display panel and a display device.

BACKGROUND

Display industry has experienced decades of development and has been rapidly changed, for example, from the cathode ray tube (CRT) era to the liquid crystal display (LCD) era, and to the organic light-emitting diode era. The display industry has been closely related to people's regular live: from traditional mobile phones, tablets, televisions, and personal computers, to the current electronic devices such as smart wearable devices and virtual reality (VR) devices, display technology is inseparable.

The polarizer is one of the important components of a display device. During the display process of the display device, when the display device is viewed obliquely in an observation plane along the absorption axis of the polarizer, the display brightness is low; when the display device is viewed obliquely in an observation plane along the direction perpendicular to the absorption axis of the polarizer, the display brightness is relatively high. That is, due to the existence of the polarizer, the display brightness varies significantly when the display device is viewed obliquely along different azimuth angles, which greatly affects the user experience.

The disclosed display panel and display device are directed to solve one or more problems set forth above and other problems in the art.

BRIEF SUMMARY OF THE DISCLOSURE

One aspect of the present disclosure provides a display panel, including a display region and a non-display region. The display panel includes a base substrate; and a light-emitting device layer disposed on the base substrate. The light-emitting device layer includes a plurality of sub-pixels, and a sub-pixel of the plurality of sub-pixels includes light-emitting regions and a non-light-emitting region located between two adjacent light-emitting regions. The display panel includes a light-shielding layer, disposed on the side of the light-emitting device layer away from the base substrate and including a light-shielding structure, located in the non-light-emitting region; and a polarizer, disposed on the side of the light-shielding layer away from the base substrate and having an absorption axis in a first direction. In a same sub-pixel, along the first direction, the minimum distance between the boundary of the light-emitting region of the sub-pixel and the light-shielding structure is a first distance B; along a second direction intersected with the first direction, the minimum distance between the boundary of the light-emitting region of the sub-pixel and the light-shielding structure is a second distance A; and the first distance B is larger than the second distance A.

Another aspect of the present disclosure provides a display device. The display device includes a display panel, including a display region and a non-display region. The display panel includes a base substrate; and a light-emitting device layer disposed on the base substrate. The light-emitting device layer includes a plurality of sub-pixels, and a sub-pixel of the plurality of sub-pixels includes light-emitting regions and a non-light-emitting region located between two adjacent light-emitting regions. The display panel includes a light-shielding layer, disposed on the side of the light-emitting device layer away from the base substrate and including a light-shielding structure, located in the non-light-emitting region; and a polarizer, disposed on the side of the light-shielding layer away from the base substrate and having an absorption axis in a first direction. In a same sub-pixel, along the first direction, the minimum distance between the boundary of the light-emitting region of the sub-pixel and the light-shielding structure is a first distance B; along a second direction intersected with the first direction, the minimum distance between the boundary of the light-emitting region of the sub-pixel and the light-shielding structure is a second distance A; and the first distance B is larger than the second distance A.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Various exemplary embodiments of the present disclosure will now be described in detail with reference to the accompanying drawings. It should be noted that unless specifically stated otherwise, the relative arrangement of the components and steps, numerical expressions and numerical values set forth in the embodiments do not limit the scope of the present disclosure. The following description of the at least one exemplary embodiment is merely illustrative, and by no means can be considered as limitations for the application or use of the present disclosure.

It should be noted that techniques, methods, and apparatuses known to those of ordinary skill in the relevant art may not be discussed in detail, but where appropriate, the techniques, methods, and apparatuses should be considered as part of the specification.

It should be noted that in all the examples provided and discussed herein, any specific value should be interpreted as merely exemplary and not as a limitation. Therefore, other examples of the exemplary embodiments may have different values.

It should be noted that similar reference numbers and letters indicate similar items in subsequent figures, and therefore, once an item is defined in a figure, it is not required to be further discussed or defined in the subsequent figures.

Figure 1:
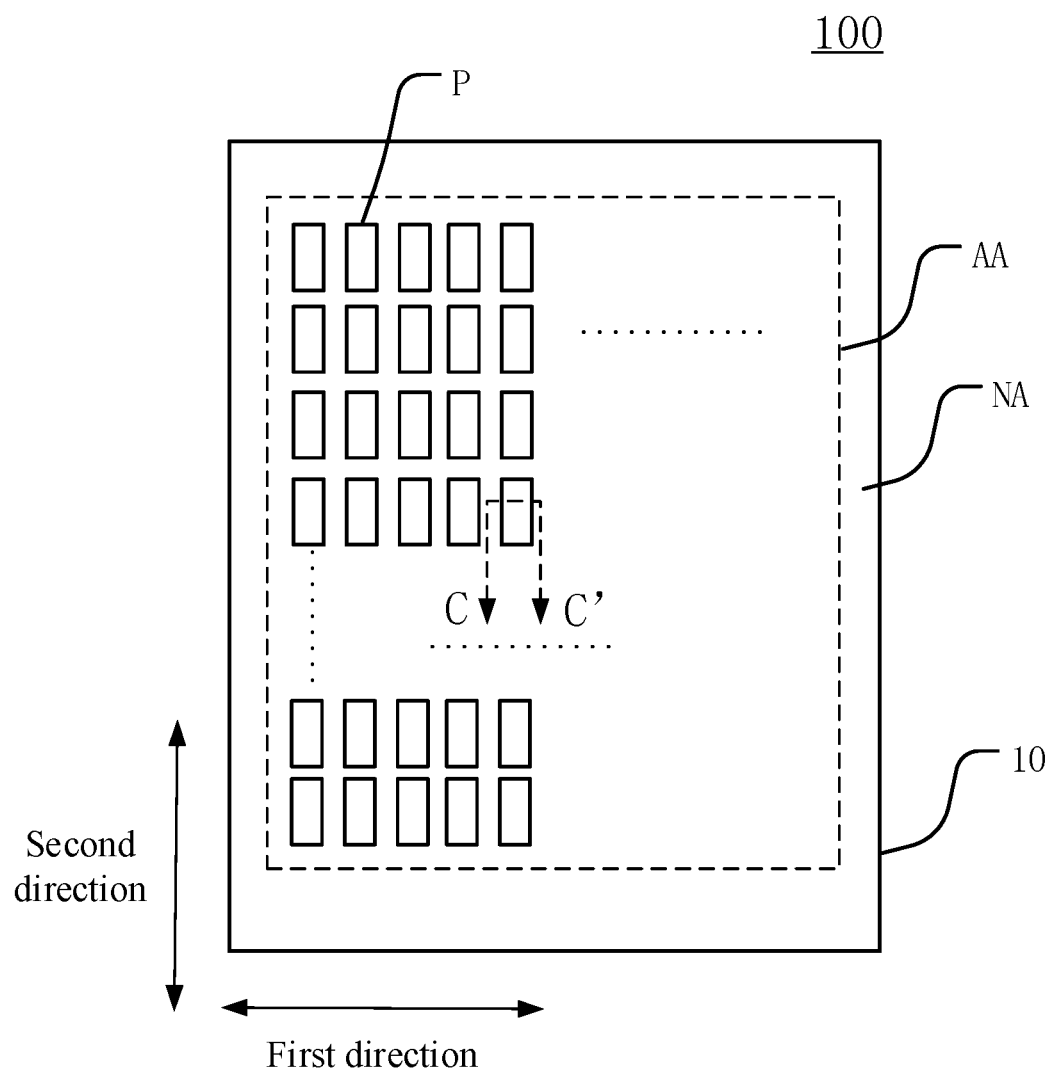
FIG. 1 illustrates a schematic structural diagram of an exemplary display panel according to various embodiments of the present disclosure.
Figure 2:
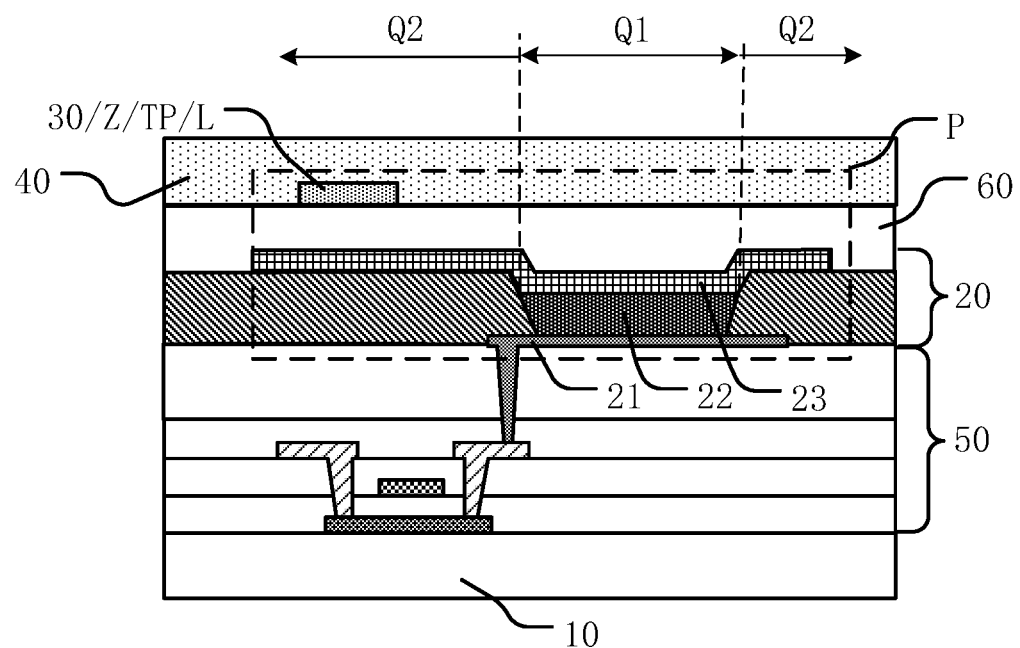
FIG. 2 illustrates a schematic cross-sectional view of the display panel shown in FIG. 1 along a CC' direction.
Figure 3:
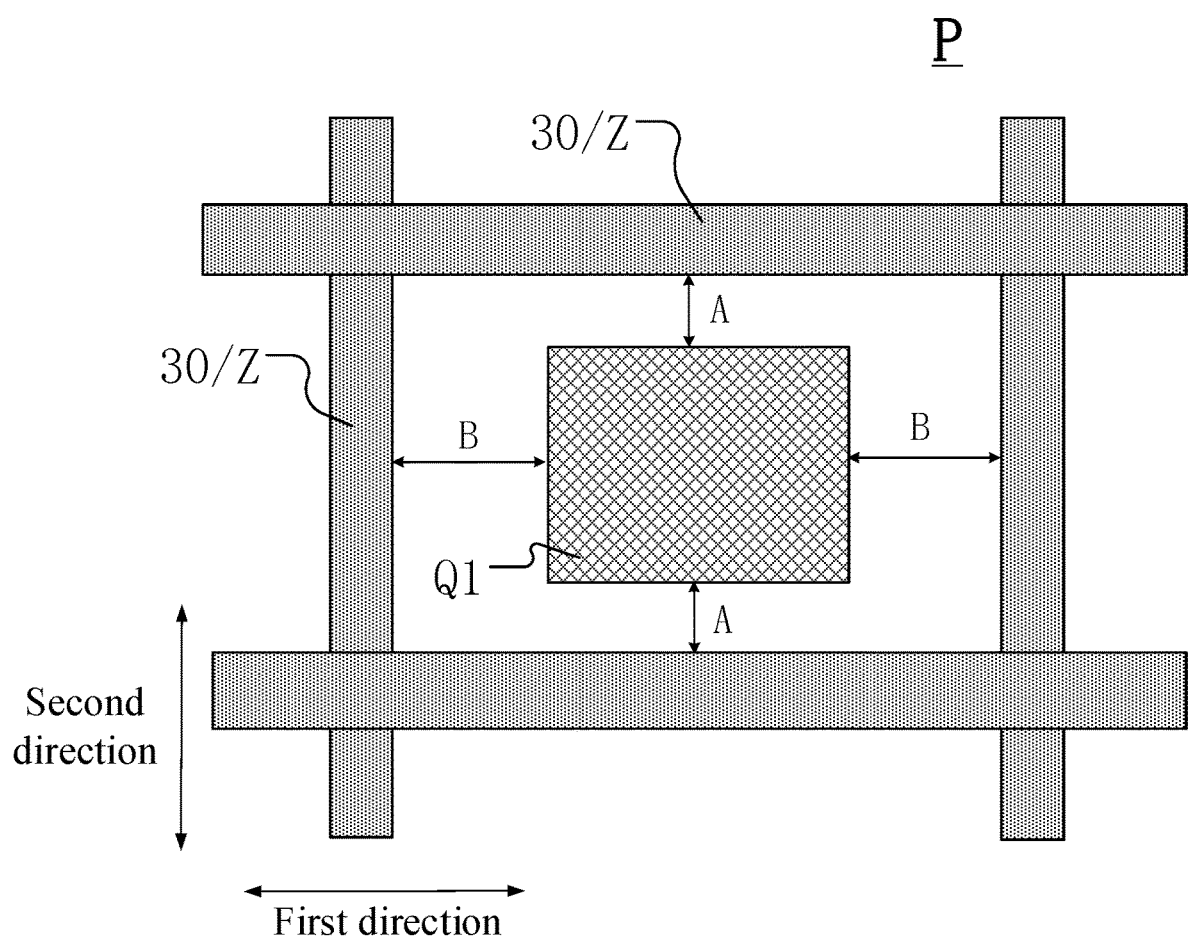
FIG. 3 illustrates a schematic diagram of a positional relationship between a light-emitting layer and a light-shielding layer of sub-pixels in an exemplary display panel according to various embodiments of the present disclosure.

FIG. 1 illustrates a schematic structural diagram of an exemplary display panel according to various embodiments of the present disclosure; FIG. 2 illustrates a schematic cross-sectional view of the display panel shown in FIG. 1 along a CC' direction; and FIG. 3 illustrates a schematic diagram of a positional relationship between a light-emitting layer and a light-shielding layer of sub-pixels in the display panel. Referring to FIGS. 1-3, the present disclosure may provide a display panel 100, including a display region AA and a non-display region NA. The display panel 100 may include a base substrate 10, and a light-emitting device layer 20 disposed on the base substrate 10. The light-emitting device layer 20 may include a plurality of sub-pixels P. Each sub-pixel P may include a light-emitting region Q1 and a non-light-emitting region Q2 located between light-emitting regions Q1 of adjacent sub-pixels P. The display panel 100 may also include a light-shielding layer Z disposed on the side of the light-emitting device layer 20 away from the base substrate 10. The light-shielding layer Z may include a light-shielding structure 30, and the light-shielding structure 30 may be located in the non-light-emitting region Q2. The display panel 100 may further include a polarizer 40, disposed on the side of the light-shielding layer Z away from the base substrate. The direction of the absorption axis of the polarizer 40 may be a first direction.

In a same sub-pixel P, the minimum distance between the boundary of the light-emitting region Q1 of the sub-pixel P and the light-shielding structure 30 along the first direction may be a first distance B; and the minimum distance between the boundary of the light-emitting region Q1 of the sub-pixel P and the light-shielding structure 30 in a second direction, which is intersected with the first direction, may be a second distance A. In one embodiment, B is greater than A, e.g., B>A.

It should be noted that in FIG. 1, a rectangular display panel 100 is merely taken as an example of the disclosed display panel for illustration. In other embodiments of the present disclosure, the display panel may have other shapes, such as a circular shape, an oval shape, or a special shape. In addition, the sizes of the display region AA and the non-display region NA are also indicative, and do not represent the actual sizes. In FIG. 1, a rectangular structure is merely taken as an example to illustrate the sub-pixels P on the display panel 100, and any appropriate shape and size of the sub-pixel P may be encompassed in the present disclosure. For illustrative purposes, FIG. 2 only illustrates some of the film layers included in the display panel 100 according to various embodiments of the present disclosure, and any appropriate number and size of the film layers may be encompassed in the present disclosure. FIG. 3 only illustrates the relative positional relationship between the light-emitting region Q1 and the light-shielding layer Z corresponding to one sub-pixel P, and any appropriate size of the light-emitting region Q1 and the light-shielding layer Z may be encompassed in the present disclosure.

For example, referring to FIG. 1, the display panel 100 according to various embodiments of the present disclosure may include a plurality of sub-pixels P arranged in an array. The display panel may realize the display function using the plurality of sub-pixels P. FIG. 1 only uses the array arrangement as an example to illustrate the arrangement of the sub-pixels P in the display panel 100. In other embodiments of the present disclosure, the plurality of sub-pixels may have different arrangements. The present disclosure does not limit the arrangement of the plurality of sub-pixels to any specific configuration.

In one embodiment, referring to FIG. 2, in each sub-pixel P, the light-emitting device layer 20 may include an anode layer 21, an organic light-emitting material layer 22, and a cathode layer 23. In other embodiments, the light-emitting device layer may further include at least one of a hole injection layer, a hole transmission layer, an electron blocking layer, a hole blocking layer, an electron transmission layer, or an electron injection layer.

In one embodiment, to drive the light-emitting region Q1 of each sub-pixel P to emit light, the display panel 100 may further include an array layer 50. The array layer 50 may be disposed between the base substrate 10 and the light-emitting device layer 20. A plurality of driving transistors may be disposed in the array layer 50, and the anode layer 21 of the light-emitting device layer 20 may be electrically connected to the output terminal of the driving transistors.

In one embodiment, to ensure desired waterproof performance of the display panel 100, the display panel 100 of the present disclosure may further include an encapsulation layer 60. The encapsulation layer 60 may be disposed on the side of the light-emitting device layer 20 away from the base substrate 10, for example, between the light-emitting device layer 20 and the light-shielding layer Z, such that the light-emitting device layer 20 of the display panel 100 may be reliably packaged. As such, external water vapor and oxygen may be prevented from entering the display panel 100 and thus affecting the normal light emission of the sub-pixels P.

In one embodiment, the polarizer 40 may be a circular polarizer 40. When the polarizer 40 is not provided in the display panel 100, the light reflected by the metal material in the display panel 100 may be directed to human eyes under ambient light, thereby reducing the contrast of the display panel 100 and affecting the user experience. When the polarizer 40 is provided in the display panel 100, the light reflected by the metal material in the display panel 100 may be filtered by the polarizer 40 to prevent the reflected light from being directed to human eyes, thereby conducive to improving the contrast of the display panel 100.

Figure 4:
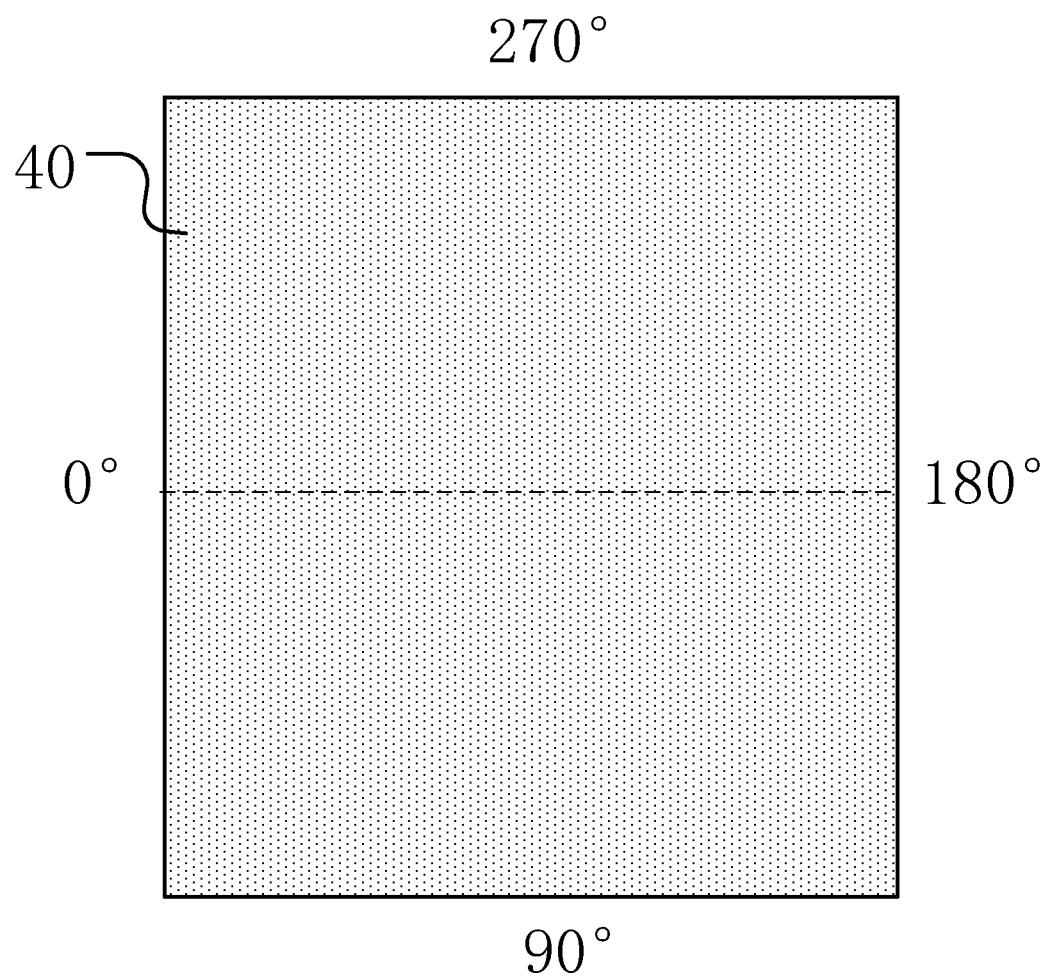
FIG. 4 illustrates a schematic diagram of an absorption axis of a polarizer in a display panel.
Figure 5:
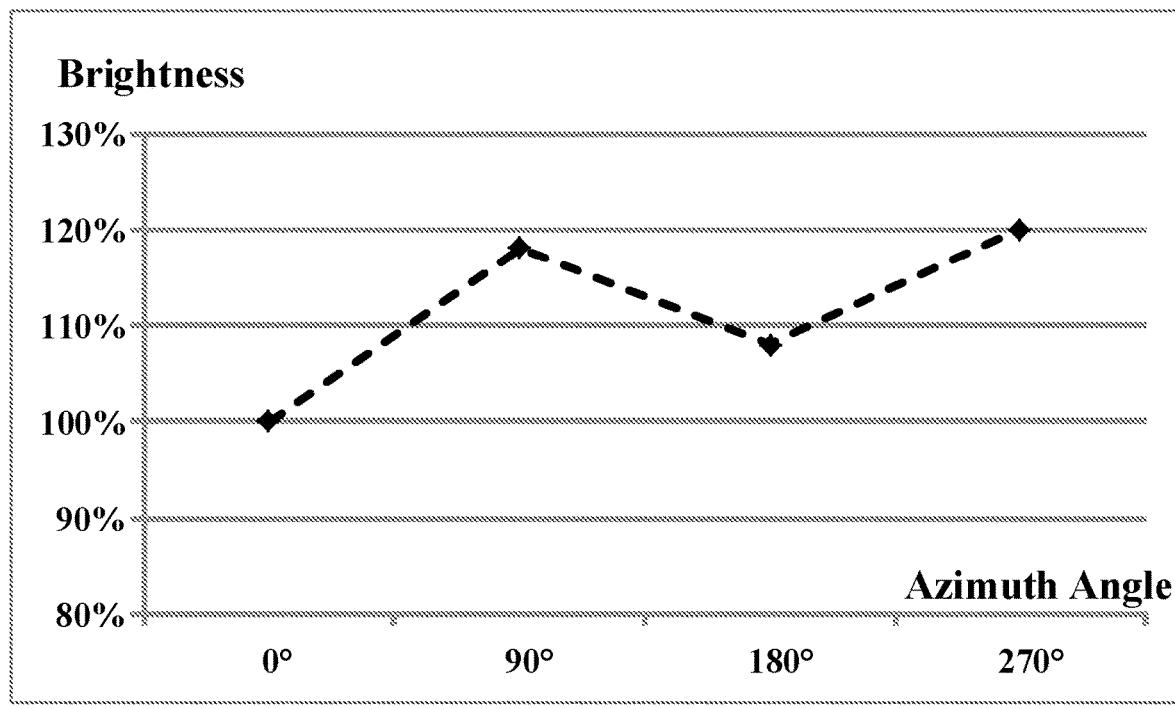
FIG. 5 illustrates a schematic brightness comparison diagram when viewing a display panel with a 60° oblique angle from different azimuth angles.

In existing display panels, the absorption axis of the polarizer 40 is fixed. FIG. 4 illustrates a schematic diagram of an absorption axis of a polarizer in a display panel, and FIG. 5 illustrates a schematic brightness comparison diagram when viewing a display panel with a 60° oblique angle from different azimuth angles. In FIG. 5, the direction of the absorption axis of the polarizer is along the dotted line shown in FIG. 4, and the two opposite extension directions of the dotted line correspond to 0° and 180°, respectively. Referring to FIGS. 4-5, when viewing the display panel obliquely in an observation plane along the direction of the absorption axis of the polarizer (0° or 180°), the light is strongly reflected and weakly transmitted on the interface of the cover glass of the display panel, and thus the brightness may be low. When viewing the display panel 100 obliquely in an observation plane along a direction perpendicular to the absorption axis of the polarizer (90° or 270°), the light is weakly reflected and strongly transmitted on the interface of the cover glass of the display panel, and thus the brightness may be high. Therefore, the brightness of the display panel when viewed in an observation plane along the direction perpendicular to the absorption axis of the polarizer (90° or 270°) may be significantly higher than the brightness of the display panel when viewed in an observation plane along the direction of the absorption axis of the polarizer (0° or 180°). That is, when the display panel is viewed obliquely along different azimuth angles, the brightness of the display panel varies significantly, which affects the user experience.

It should be noted that the observation plane along the direction of the absorption axis of the polarizer 40 refers to a plane defined by the normal direction of the polarizer 40 and the direction of the absorption axis of the polarizer 40, and the observation plane along the direction perpendicular to the absorption axis of the polarizer 40 refers to a plane defined by the normal direction of the polarizer 40 and the direction perpendicular to the absorption axis of the polarizer 40.

To reduce the difference in the brightness of the display panel viewed from different azimuth angles, referring to FIGS. 1-3, a light-shielding layer Z may be disposed on the side of the light-emitting device layer 20 away from the base substrate 10, and a polarizer 40 may be disposed on the side of the light-shielding layer Z away from the base substrate 10. The absorption axis of the polarizer 40 may be a first direction. In other words, the light-shielding layer Z may be disposed between the light-emitting device layer 20 and the polarizer 40. When the sub-pixels of the light-emitting device layer 20 emit light, the light-shielding layer Z may be able to block the light to a certain extent at different viewing angles.

For example, referring to FIG. 3, in a same sub-pixel P, along the direction of the absorption axis of the polarizer 40, e.g., the first direction, the minimum distance between the boundary of the light-emitting region Q1 of the sub-pixel P and the light-shielding structure 30 in the light-shielding layer Z may be the first distance B (it should be noted that the first distance B here refers to the minimum distance between a point on the light-shielding structure 30 that is, in the first direction, closest to the boundary of the light-emitting region Q1 of the sub-pixel P and the boundary of the light-emitting region Q1); along the second direction intersected with the first direction, the minimum distance between the boundary of the light-emitting region Q1 of the sub-pixel P and the light-shielding structure 30 in the light-shielding layer Z may be the second distance A (it should be noted that the second distance A here refers to the minimum distance between a point on the light-shielding structure 30 that is, in the second direction, closest to the boundary of the light-emitting region Q1 of the sub-pixel P and the boundary of the light-emitting region Q1). According to the present disclosure, the first distance B may be larger than the second distance A (B>A), so that the light-shielding structure 30 may have a smaller shielding range for the sub-pixel P along the direction of the absorption axis of the polarizer 40, and have a larger shielding range for the sub-pixel P along the direction intersected with the absorption axis of the polarizer 40. Therefore, when the display panel 100 is viewed obliquely in the observation plane along the direction of the absorption axis of the polarizer 40, since the range of the sub-pixel P shielded by the light-shielding structure is smaller, more light may be able to enter the human eye, thereby conducive to improving the display brightness of the display panel 100 viewed at an oblique viewing angle in the observation plane along the direction of the absorption axis. When the display panel 100 is viewed obliquely in the observation plane along the second direction that is intersected with the absorption axis of the polarizer 40, since the range of the sub-pixel P shielded by the light-shielding structure is larger, less light may be able to enter the human eye, thereby conducive to reducing the display brightness of the display panel 100 viewed at an oblique viewing angle in the observation plane along the second direction that is intersected with the absorption axis of the polarizer 40.

Therefore, the present disclosure is able to reduce the difference between the display brightness of the display panel 100 when the display panel 100 is viewed obliquely in the observation plane along the direction of the absorption axis of the polarizer 40 and the display brightness of the display panel 100 when the display panel 100 is viewed obliquely in the observation plane along the second direction intersected with the absorption axis of the polarizer 40. That is, the present disclosure is beneficial to reduce the difference in the display brightness of the display panel 100 at different viewing angles, and thus is conducive to improving the uniformity of the display brightness of the display panel 100 at different viewing angles, and improves the user experience.

It should be noted that the present disclosure is only described by taking the first direction perpendicular to the second direction as an example. In other embodiments of the present disclosure, the first direction and the second direction may be embodied as having a non-perpendicular intersection relationship, and the present disclosure does not limit the intersection relation between the first direction and the second direction to any specific configuration.

Figure 6:
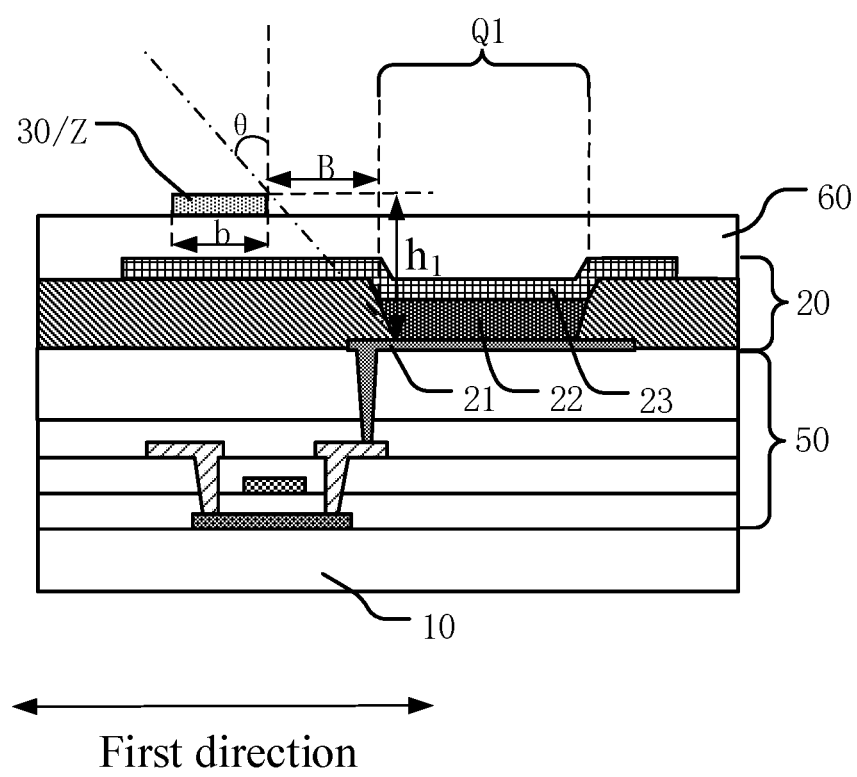
FIG. 6 illustrates another schematic cross-sectional view of the display panel shown in FIG. 1 along the CC' direction.
Figure 7:
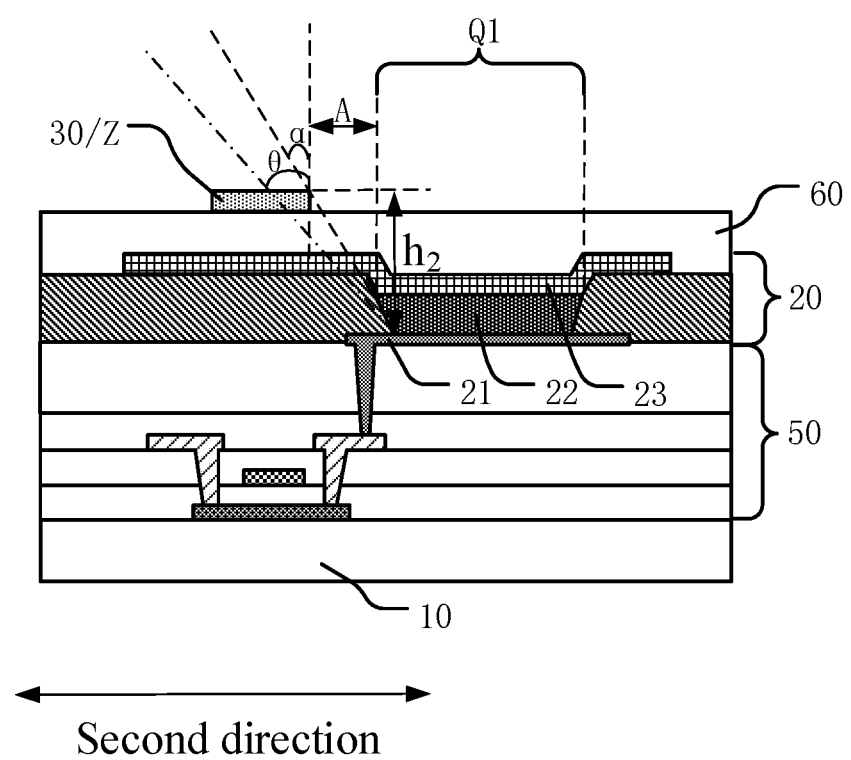
FIG. 7 illustrates another schematic cross-sectional view of the display panel shown in FIG. 1 along the CC' direction.

FIG. 6 and FIG. 7 each illustrates another schematic cross-sectional view of the display panel shown in FIG. 1 along the CC' direction. The light-shielding structure 30 in FIG. 6 corresponds to the light-shielding structure 30 located on the left side of the light-emitting region Q1 of the sub-pixel P under the viewing angle shown in FIG. 3; and the light-shielding structure 30 in FIG. 7 corresponds to the light-shielding structure 30 located on the upper side of the light-emitting region Q1 of the sub-pixel P under the viewing angle shown in FIG. 3. It should be noted that the polarizer 40 (referring to FIG. 2) is not shown in FIG. 6 and FIG. 7.

FIG. 6 represents a case where the display panel 100 is viewed with an oblique viewing angle θ in the observation plane along the direction of absorption axis of the polarizer 40, and FIG. 7 represents a case where the display panel 100 is viewed with the same oblique viewing angle θ in the observation plane along the second direction perpendicular to the direction of absorption axis of the polarizer 40. It can be seen that when the display panel 100 is viewed at the viewing angle shown in FIG. 6, since the first distance B between the light-shielding structure 30 and the light-emitting region Q1 of the sub-pixel P is large, the light-shielding structure 30 may not be able to shield the light from the light-emitting region Q1 of the sub-pixel P, so that more light may enter the human eye. Therefore, the brightness of the display panel 100 viewed at this viewing angle is high, which may effectively solve the low display-brightness problem in existing display panels when being viewed obliquely in the observation plane along the direction of the absorption axis of the polarizer.

When the display panel 100 is viewed at the viewing angle shown in FIG. 7, since the second distance A between the light-shielding structure 30 and the light-emitting region Q1 of the sub-pixel P is small, with the same oblique viewing angle θ, a portion of the light may be blocked by the light-shielding structure 30, thereby reducing the amount of light entering the human eye. As such, the brightness of the display panel 100 viewed at this viewing angle may be reduced, which may effectively solve the high display-brightness problem in existing display panels when being viewed obliquely in the observation plane along the direction perpendicular to the absorption axis of the polarizer.

Therefore, designing B to be larger than A (B>A) may be able to improve the display brightness of the display panel 100 when the display panel 100 is viewed obliquely in an observation plane along the direction of the absorption axis of the polarizer 40, and reduce the display brightness of the display panel 100 when the display panel 100 is viewed obliquely in an observation plane along the direction perpendicular to the absorption axis of the polarizer 40. Therefore, the difference in the brightness of the display panel 100 at different viewing angles may be reduced, which is conducive to improving the uniformity of the display brightness of the display panel 100 at different viewing angles.

Further, referring to FIG. 6, in one embodiment, the display panel 100 may include an encapsulation layer 60. It should be noted that the polarizer 40 (referring to FIG. 2) is not shown in the figure.

In one embodiment, referring to FIG. 6, the display panel 100 may further include an encapsulation layer 60. The encapsulation layer 60 may be disposed between the light-emitting device layer 20 and the polarizer 40. The sub-pixel P may include an anode layer 21. In a same sub-pixel P, $\arctan(B/h_1) > \arcsin(1/n)$, where $h_1$ is the distance between the surface of the light-shielding structure 30 on the side away from the base substrate 10 and the anode layer 21 in the direction perpendicular to the base substrate 10, and n is the refractive index of the encapsulation layer 60.

For example, referring to FIG. 6, an encapsulation layer 60 may be disposed in the display panel 100, and the encapsulation layer 60 may be located between the light-shielding structure 30 and the light-emitting device layer 20. The encapsulation layer 60 may be used to encapsulate the light-emitting device layer 20, thereby effectively preventing external water vapor and oxygen from entering the display panel 100 and thus affecting the normal light emission of the light-emitting device layer 20. In one embodiment, the encapsulation layer 60 may be embodied as a stack structure of inorganic layer-organic layer-inorganic layer, and the refractive index n of the encapsulation layer 60 at this time may be embodied as the equivalent refractive index in the encapsulation layer 60. The so-called equivalent refractive index may be understood as when the encapsulation layer 60 is equivalent to a single film layer, the refractive capability of the single film layer for incident light, that is, the effective refractive index of the single film layer. The equivalent refractive index is related to the refractive index and the thickness of each layer in the composite film layer.

Further, when the encapsulation layer 60 is a stacked structure of inorganic layer-organic layer-inorganic layer, since the thickness of the organic layer is much larger than the thickness of the inorganic layer, the equivalent refractive index of the encapsulation layer 60 may be regarded as the refractive index of the organic layer.

According to the present disclosure, $\arctan(B/h_1)$ refers to the included angle θ in FIG. 6 (it should be noted that θ herein refers to the included angle when the light emitted by the light-emitting region Q1 is transmitted inside the display panel 100; the light at this time has not yet exited the display panel 100; and when the light is transmitted out, because the refractive index of the air is different from that of the encapsulation layer 60, the light is deflected at a certain angle); in $\arcsin(1/n)$, 1 represents the refractive index of the air, n represents the refractive index of the encapsulation layer 60, $\arcsin(1/n)$ refers to the deflection angle of the light from the light-emitting region Q1 with respect to the normal direction of the light-emitting surface of the display panel 100 after being emitted out from the display panel 100. According to the present disclosure, setting $\arctan(B/h_1)$ to be larger than $\arcsin(1/n)$ may be conducive to ensuring that after the light emitted from the light-emitting region Q1 enters the air, when the observer views at any oblique viewing angle (0° to 90°) in the observation plane along the absorption axis of the polarizer 40, the light-shielding structure 30 may not block the light emitted from the opening region, which is conducive to improving the display brightness of the display panel 100 when being viewed obliquely in the observation plane along the absorption axis of the polarizer 40, and thus beneficial to solve the low display-brightness problem in existing display panels when being viewed obliquely in the observation plane along the direction of the absorption axis of the polarizer. In one embodiment, the value of $B/h_1$ may be set as $0.84 < B/h_1 < 2$.

Further, referring to FIG. 6, in one embodiment, the value of $B/h_1$ may be set as $0.84<B/h_1<2$, that is $B>0.84h_1$, and $B<2h_1$. Since the refractive index of the organic layer in the encapsulation layer 60 is usually n=1.55, $\arctan(B/h_1)>\arcsin(1/n)$ may become $\arctan(B/h_1)>\arcsin(1/1.55)$, and thus $B>0.84h_1$, and $\delta>40.18°$. With $B>0.84h_1$, B is large enough, and when the display panel 100 is viewed obliquely in the observation plane along the direction of the absorption axis of the polarizer 40 (corresponding to the first direction shown in FIG. 6), the range of the sub-pixel P shielded by the light-shielding structure may be limited at this viewing angle, and thus additional loss in brightness may be avoided, which is conducive to further improving the brightness of the display panel 100 when the display panel 100 is viewed obliquely in the observation plane along the direction of the absorption axis of the polarizer 40, and thus solving the low display-brightness problem in existing display panels when being viewed obliquely in the observation plane along the direction of the absorption axis of the polarizer.

Further, with $\theta>40.18°$, when the light emitted from the light-emitting region is transmitted out from the display panel, the light may be able to cover any angle between 0° and 90°, which means that no matter at which viewing angle the human eye views in the observation plane along the direction of the absorption axis, the light emitted from the light-emitting region may be injected into the human eye, thereby ensuring the amount of light that the human eye can receive, which is conducive to improving the display brightness of the display panel when the display panel is viewed obliquely in the observation plane along the absorption axis of the polarizer.

Moreover, according to the present disclosure, setting $B<2h_1$ may ensure that the first distance B between the boundary of the light-emitting region Q1 and the light-shielding structure 30 is not too large. When the first distance B is too large, the size of the non-light-emitting region Q2 of the corresponding sub-pixel P may also be large. Therefore, setting $B<2h_1$ may be able to not only ensure the brightness of the display panel 100 when the display panel 100 is viewed obliquely in the observation plane along the direction of the absorption axis of the polarizer 40, but also help to prevent the size of the non-light-emitting region Q2 from being too large and thus resulting in a decrease in the pixel density of the display panel 100. Therefore, the present disclosure may also be conducive to increase the screen-to-body ratio of the display panel 100.

Further, referring to FIG. 7, in one embodiment, the display panel 100 may also include an encapsulation layer 60. It should be noted that the polarizer 40 (referring to FIG. 2) is not shown in FIG. 7.

Referring to FIG. 7, in a same sub-pixel P, $\arctan(A/h_2)$ may be smaller than $\arcsin(1/n)$, that is $\arctan(A/h_2)<\arcsin(1/n)$, where $h_2$ is the distance between the surface of the light-shielding structure 30 on the side away from the base substrate 10 and the anode in the direction perpendicular to the base substrate 10.

For example, when $\arctan(A/h_2)<\arcsin(1/n)$, $\arctan(A/h_2)$ refers to an included angle α in FIG. 7 (it should be noted that a here refers to the included angel when the light emitted by the light-emitting region Q1 is transmitted inside the display panel 100; the light at this time has not yet exited the display panel 100; and when the light is transmitted out, because the refractive index of the air is different from that of the encapsulation layer 60, the light is deflected at a certain angle); in $\arcsin(1/n)$, 1 represents the refractive index of the air, n represents the refractive index of the encapsulation layer 60, $\arcsin(1/n)$ refers to the deflection angle of the light from the light-emitting region Q1 with respect to the normal direction of the light-emitting surface of the display panel 100 after being emitted out from the display panel 100. According to the present disclosure, $\arctan(A/h_2)$ is designed to be smaller than $\arcsin(1/n)$. when the display panel 100 is viewed obliquely in the observation plane along the second direction perpendicular to the direction of the absorption axis of the polarizer 40, a portion of the light may not be transmitted in to the human eye from the display panel for recognition. For example, light with an angle θ may be blocked by the light-shielding structure 30, which is equivalent to increasing the range of the light-emitting region Q1 shielded by the light-shielding structure 30 in the second direction. Therefore, setting $\arctan(A/h_2)<\arcsin(1/n)$ may be conducive to reducing the display brightness of the display panel 100 when the display panel 100 is viewed obliquely in the observation plane along the second direction, thereby solving the high display-brightness problem in existing display panels when being viewed obliquely in the observation plane along the direction perpendicular to the absorption axis of the polarizer.

It should be understandable that, under the premise of $\arctan(B/h_1)>\arcsin(1/n)$, when setting $\arctan(A/h_2)<\arcsin(1/n)$, $B/h_1>A/h_2$ can be obtained, and by adjusting the values of $h_1$ and $h_2$, the requirement of B>A may be satisfied, such that when the display panel 100 is viewed obliquely in the observation plane along the direction of the absorption axis of the polarizer 40, the range of the sub-pixel P shielded by the light-shielding structure 30 may be small or the light-shielding structure 30 may not block any portion of the sub-pixel P at all. Therefore, more light may enter the human eye, which is conducive to improving the display brightness at this viewing angle. At the same time, when the display panel 100 is viewed obliquely in the observation plane along the direction intersected with the direction of the absorption axis of the polarizer 40, the range of the sub-pixel P shielded by the light-shielding structure 30 may be large. Therefore, the amount of light entering the human eye may be reduced, which is conducive to reducing the brightness at this viewing angle. As such, when the display panel 100 is viewed in the observation plane along the second direction intersected with the direction of the absorption axis of the polarizer 40, the brightness of the display panel 100 may be reduce, such that the display brightness at the two viewing angles may be close to each other, which is conducive to improving the uniformity of the display brightness of the display panel at different viewing angles.

In one embodiment, referring to FIG. 3, FIG. 6 and FIG. 7, $h_1$ may be equal to $h_2$, e.g., $h_1=h_2$, such that in the light-shielding layer Z shown in FIG. 3, along the direction perpendicular to the base substrate 10, the distance between the surface of each light-shielding structure 30 on the side away from the base substrate 10 and the anode may be the same. In other words, the light-shielding structures 30 corresponding to the same sub-pixel P may be arranged in the same layer. In this way, the light-shielding structures 30 corresponding to the sub-pixels P may be manufactured in the same manufacturing process without introducing different manufacturing processes for different light-shielding structures, thereby conducive to simplifying the manufacturing process of the display panel 100, an d thus improving the production efficiency of the display panel 100.

In one embodiment, referring to FIGS. 2-3, the ratio of A to B may be in a range from 0.4 to 0.8, e.g., $0.4 \leq A/B \leq 0.8$. In other words, $1.25A \leq B \leq 2.5A$. When B<1.25A, along the first direction, the first distance B from the boundary of the light-emitting region Q1 of the sub-pixel P to the light-shielding structure 30 may be small. When the display panel 100 is viewed obliquely at a certain angle in the observation plane along the first direction and in the observation plane along the second direction, respectively, although the display brightness corresponding the two viewing angles may be improved to some extent, some differences may still exist. When B≥1.25A, along the first direction, the first distance B from the boundary of the light-emitting region Q1 of the sub-pixel P to the light-shielding structure 30 may be large. When the display panel 100 is viewed obliquely at a certain angle in the observation plane along the first direction, the amount of light entering the human eye may be more, which is conducive to improving the display brightness at the viewing angle, and reducing the difference in the display brightness at different viewing angles. Further, when setting B>2.5A, the size of the non-light-emitting region Q2 corresponding to the sub-pixel P may be too large, so that the entire non-light-emitting region Q2 in the display panel 100 may be large, which is not conducive to increasing the pixel density of the display panel 100. Therefore, in one embodiment, the ratio of A to B may be set in a range from 0.4 to 0.8, e.g., 0.4≤A/B≤0.8. Setting 0.4≤A/B≤0.8 may be not only conducive to reducing the difference in the display brightness of the display panel 100 at different viewing angles, and thus improving the user's visual experience, but also beneficial to avoid reducing the pixel density of the display panel 100.

Figure 8:
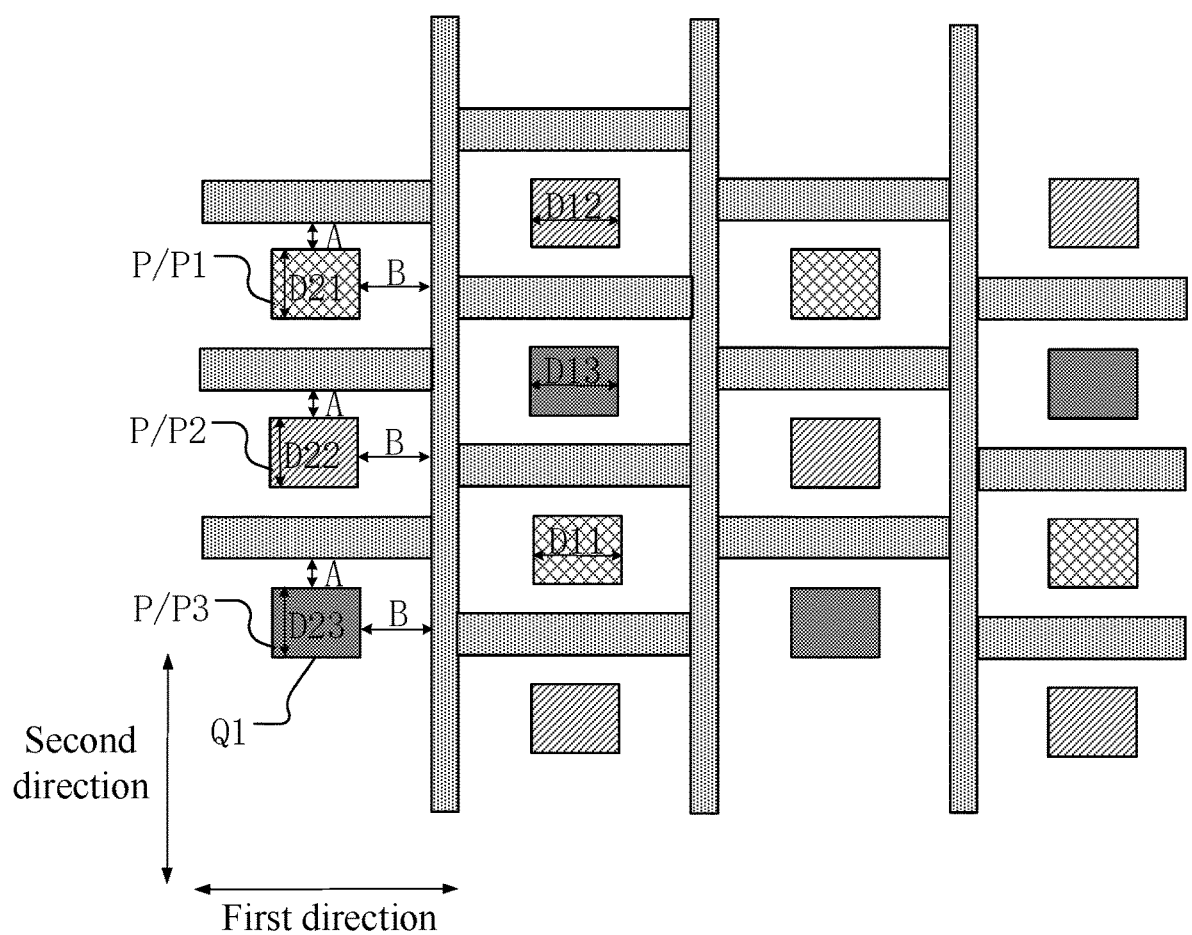
FIG. 8 illustrates a schematic diagram of an exemplary positional relationship between a plurality of sub-pixels and a light-shielding structure in a display panel according to various embodiments of the present disclosure.

FIG. 8 illustrates a schematic diagram of an exemplary positional relationship between a plurality of sub-pixels and a light-shielding structure in a display panel according to various embodiments of the present disclosure. Referring to FIG. 8, in one embodiment, the sub-pixels P in the display panel may include first-color sub-pixels P1, second-color sub-pixels P2, and third-color sub-pixels P3. The first-color sub-pixels P1, the second-color sub-pixels P2, and the third-color sub-pixels P3 may be arranged in a manner illustrated in FIG. 8. It should be noted that different filling patterns are adopted to represent the light-emitting regions Q1 corresponding to different colors.

In one embodiment, referring to FIG. 8, the plurality of sub-pixels P may include first-color sub-pixels P1, second-color sub-pixels P2, and third-color sub-pixels P3. The second distance A corresponding to the first-color sub-pixels P1, the second distance A corresponding to the second-color sub-pixels P2, and the second distance A corresponding to the third-color sub-pixels P3 may be the same.

For example, referring to FIG. 8, along the second direction, the light-emitting region Q1 corresponding to each of the first-color sub-pixels P1, the second-color sub-pixels P2, and the third-color sub-pixels P3 in the display panel 100 may have a same second distance A to the closest light-shielding structure 30. As such, when the display panel 100 is viewed obliquely at a certain angle in the observation plane along the direction (e.g., the second direction) perpendicular to the absorption axis of the polarizer 40, the shielding effect of the light-shielding structure 30 on the sub-pixels P of different colors may be consistent at this viewing angle. The amount of light emitted from the light-emitting regions Q1 of the sub-pixels P of different colors at the viewing angle may be approximately the same, which is conducive to avoiding the color shift that may be caused when the amounts of light emitted from the light-emitting regions Q1 of the sub-pixels P of different colors to the human eye are different. Therefore, setting the second distances A corresponding to sub-pixels P of different colors to be the same may also be conducive to avoiding the color shift problem of the display panel 100 at the corresponding viewing angle when the display panel is viewed in the observation plane along the direction perpendicular to the absorption axis of the polarizer 40, and thus may be conducive to improving the display effect of the display panel 100 at this viewing angle.

In one embodiment, referring to FIG. 8, along the second direction, the width D11 of the light-emitting region Q1 of the first-color sub-pixel P1, the width D12 of the light-emitting region Q1 of the second-color sub-pixel P2, and the width D13 of the light-emitting region Q1 of the third-color sub-pixel P3 may be the same. That is, according to the present disclosure, the widths of the light-emitting regions Q1 of the sub-pixels P of different colors along the second direction may be set to equal each other. When viewing the display panel 100 obliquely at a certain angle in the observation plane along the second direction, for example, viewing the display panel 100 obliquely at a certain angle in the observation plane along the 90° direction as shown in FIG. 4 or viewing the display panel 100 obliquely at a certain angle in the observation plane along the 270° direction as shown in FIG. 4, for sub-pixels with different colors, the amount of light entering the human eye at the above two viewing angles may be the same or approximately the same. Therefore, setting the widths of the light-emitting regions Q1 of the sub-pixels P of different colors in the second direction to be the same may be beneficial to improve the uniformity of the display brightness of the display panel 100 when the display panel 100 is viewed from the two opposite sides in the second direction, thereby conducive to improving the user's visual experience.

In one embodiment, referring to FIG. 8, the plurality of sub-pixels P may include first-color sub-pixels P1, second-color sub-pixels P2, and third-color sub-pixels P3. The first distance B corresponding to the first-color sub-pixels P1, the first distance B corresponding to the second-color sub-pixels P2, and the first distance B corresponding to the third-color sub-pixels P3 may be the same.

For example, referring to FIG. 8, along the first direction, the light-emitting region Q1 corresponding to each of the first-color sub-pixels P1, the second-color sub-pixels P2, and the third-color sub-pixels P3 in the display panel 100 may have a same first distance B to the closest light-shielding structure 30. As such, when the display panel 100 is viewed obliquely at a certain angle in the observation plane along the direction (e.g., the first direction) perpendicular to the absorption axis of the polarizer 40, the shielding effect of the light-shielding structure 30 on the sub-pixels P of different colors may be consistent at this viewing angle. The amount of light emitted from the light-emitting regions Q1 of the sub-pixels P of different colors at the viewing angle may be approximately the same, which is conducive to avoiding the color shift that may be caused when the amounts of light emitted from the light-emitting regions Q1 of the sub-pixels P of different colors to the human eye are different. Therefore, setting the first distance B corresponding to sub-pixels P of different colors to be the same may also be conducive to avoiding the color shift problem of the display panel 100 at the corresponding viewing angle when the display panel is viewed in the observation plane along the direction of the absorption axis of the polarizer 40, and thus may be conducive to improving the display effect of the display panel 100 at this viewing angle.

In one embodiment, referring to FIG. 8, along the first direction, the width D21 of the light-emitting region Q1 of the first-color sub-pixel P1, the width D22 of the light-emitting region Q1 of the second-color sub-pixel P2, and the width D23 of the light-emitting region Q1 of the third-color sub-pixel P3 may be the same. That is, according to the present disclosure, the widths of the light-emitting regions Q1 of the sub-pixels P of different colors along the first direction may be set to equal each other. When viewing the display panel 100 obliquely at a certain angle in the observation plane along the first direction (that is, the direction of the absorption axis of the polarizer 40), for example, viewing the display panel 100 obliquely at a certain angle in the observation plane along the 0° direction as shown in FIG. 4 or viewing the display panel 100 obliquely at a certain angle in the observation plane along the 180° direction as shown in FIG. 4, for sub-pixels with different colors, the amount of light entering the human eye at the above two viewing angles may be the same or approximately the same. Therefore, setting the widths of the light-emitting regions Q1 of the sub-pixels P of different colors in the first direction to be the same may be beneficial to improve the uniformity of the display brightness of the display panel 100 when the display panel 100 is viewed from the two opposite sides in the first direction, thereby conducive to improving the user's visual experience.

Figure 9:
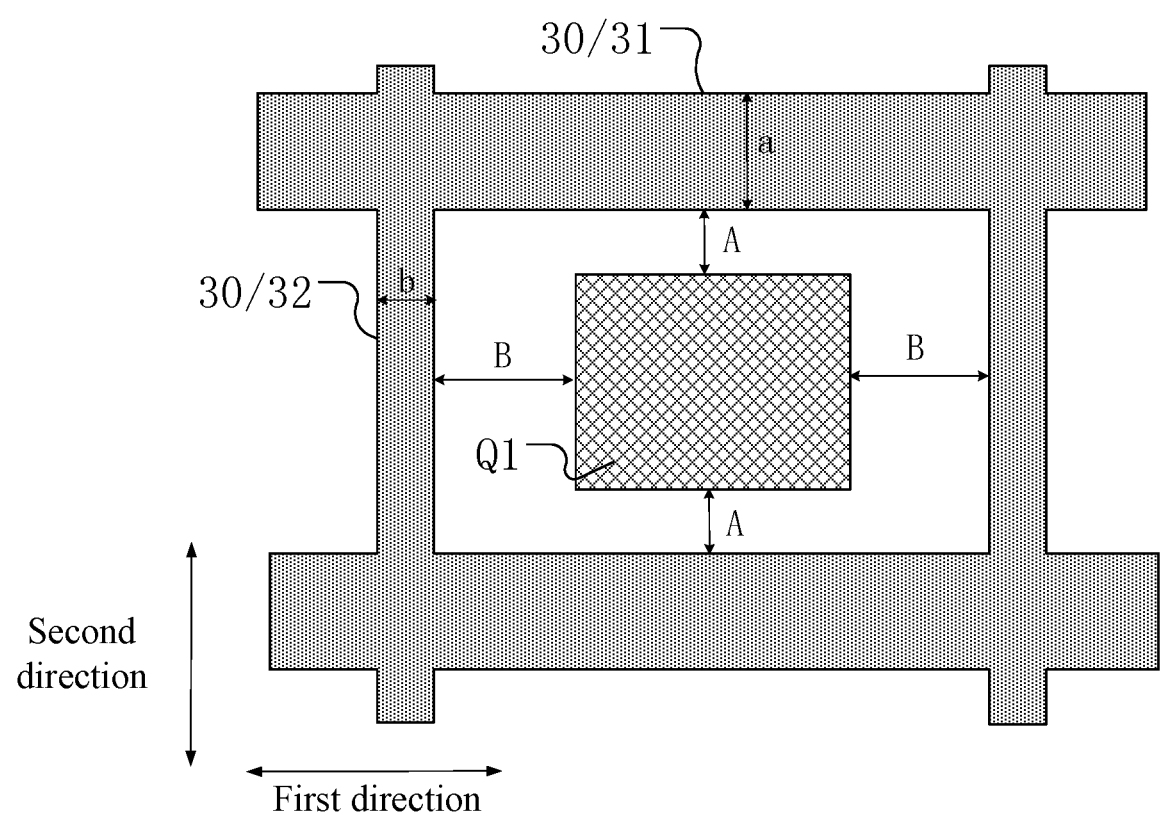
FIG. 9 illustrates a schematic diagram of another positional relationship between sub-pixels and a light-shielding layer in a display panel according to various embodiments of the present disclosure.

FIG. 9 illustrates a schematic diagram of another positional relationship between sub-pixels and a light-shielding layer in a display panel according to various embodiments of the present disclosure. Referring to FIG. 9, in one embodiment, corresponding to each sub-pixel P, the light-shielding structure 30 in the light-shielding layer Z may include a first sub-light-shielding structure 31 and a second sub-light-shielding structure 32.

In one embodiment, referring to FIG. 9, in a same sub-pixel P, the light-shielding structure 30 may include a first sub-light-shielding structure 31 and a second sub-light-shielding structure 32. The first sub-light-shielding structure 31 may extend along the first direction, and the second sub-light-shielding structure 32 may extend along the second direction. The first distance B may be the minimum distance between the second sub-light-shielding structure 32 and the boundary of the light-emitting region Q1, and the second distance A may be the minimum distance between the first sub-light-shielding structure 31 and the boundary of the light-emitting region Q1.

For example, referring to FIG. 9, the portion of the light-shielding structure 30 along the first direction may be the first sub-light-shielding structure 31, and the portion of the light-shielding structure 30 along the second direction may be the second sub-light-shielding structure 32. Thus, in the above embodiment of the present disclosure, the first distance B may be the minimum distance between the boundary of the light-emitting region Q1 and the second sub-light-shielding structure 32 closest to the boundary, and the second distance A may be the minimum distance between the boundary of the light-emitting region Q1 and the first sub-light-shielding structure 31 closest to the boundary.

According to the present disclosure, the first sub-light-shielding structure 31 and the second sub-light-shielding structure 32 may be arranged in the light-emitting region Q of the sub-pixel P. The first sub-light-shielding structure 31 may be arranged on both sides of the light-emitting region Q1 along the second direction, and the second sub-light-shielding structure 32 may be arranged on both sides of the light-emitting region Q1 along the first direction. In addition, the first distance B may be set to be larger than the second distance A, e.g., B>A. Therefore, the second sub-light-shielding structure 32 and the first sub-light-shielding structure 31 may have different shielding effects on the light emitted by the light-emitting region Q1 when the display panel 100 is viewed obliquely at a certain viewing angle in the observation plane along the first direction and along the second direction, respectively. As a result, the display brightness when the display panel 100 is viewed obliquely in the observation plane along the first direction may be increased, and the display brightness when the display panel 100 is viewed obliquely in the observation plane along the second direction may be reduced, thereby conducive to reducing the difference in the display brightness of the display panel at different viewing angles, and improving the user's visual experience.

Figure 10:
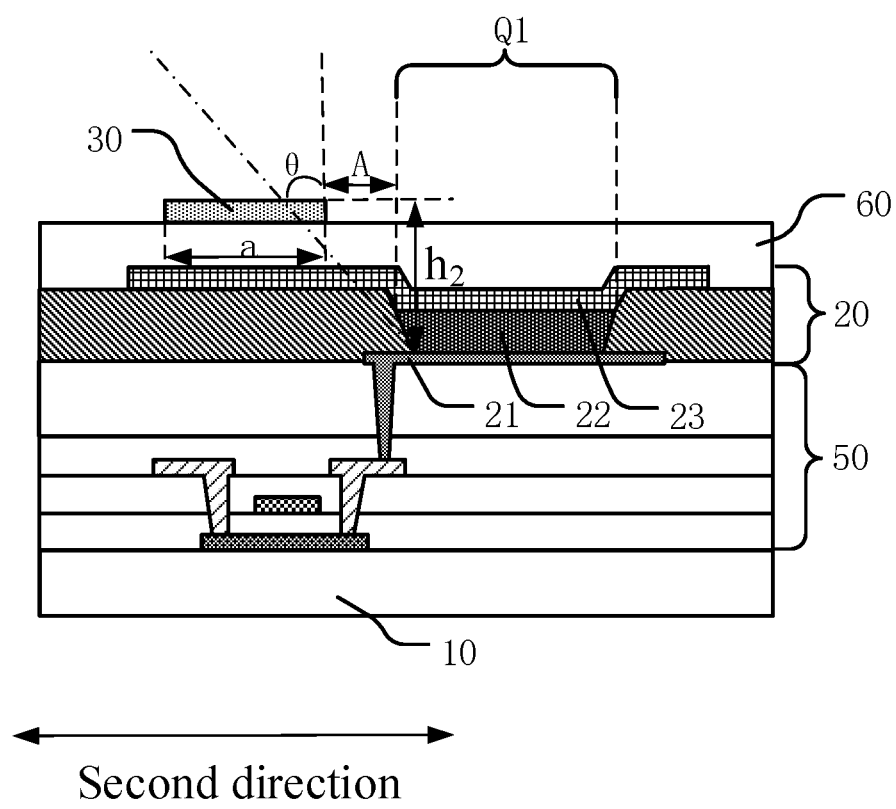
FIG. 10 illustrates another schematic cross-sectional view of the display panel shown in FIG. 1 along the CC' direction.

FIG. 10 illustrates another schematic cross-sectional view of the display panel shown in FIG. 1 along the CC' direction. Referring to FIG. 6 and FIG. 10, the widths of the first sub-light-shielding structure 31 and the second sub-light-shielding structure 32 may be different. For example, along the second direction, the width of the first sub-light-shielding structure 31 may be a; and the width of the second sub-light-shielding structure 32 may be b. In one embodiment, a>b. It should be noted that the width of the first sub-light-shielding structure 31 refers to the width of the first sub-light-shielding structure 31 in a direction perpendicular to the extension direction of the first sub-light-shielding structure 31, and the width of the second sub-light-shielding structure 32 refers to the width of the second sub-light-shielding structure 32 in a direction perpendicular to the extension direction of the second sub-light-shielding structure 32.

In one embodiment, referring to FIG. 6, FIG. 9, and FIG. 10, the dashed line shown in FIG. 6 represents that the display panel 100 may be viewed obliquely at a viewing angle θ in the observation plane along the direction of the absorption axis of the polarizer, and the dashed line shown in FIG. 10 represents that the display panel 100 may be viewed obliquely at a same viewing angle θ in the observation plane along the second direction perpendicular to the direction of the absorption axis of the polarizer. According to the present disclosure, the width of the first sub-light-shielding structure 31 in the second direction may be set larger than the width of the second sub-light-shielding structure 32 in the first direction. When the display panel 100 is viewed obliquely at a same viewing angle θ in observation planes along different directions, and the width of the first sub-light-shielding structure 31 is set to be large in the second direction, the first light-shielding structure with a large width may be able to provide reliable shielding for light emitted from the light-emitting region Q1, thereby preventing light emitted from the light-emitting region Q1 from being transmitted out from the left side of the first sub-light-shielding structure 31 (on the left side of the viewing angle shown in FIG. 10) when the width of the first light-shielding structure 31 is set small. Therefore, the display brightness when the display panel 100 is viewed obliquely at a certain angle in the observation plane along the second direction may be effectively reduced, thereby conducive to further solving the high display-brightness problem in existing display panels when being viewed obliquely in the observation plane along the direction perpendicular to the absorption axis of the polarizer. As such, the disclosed display panel 100 may be conducive to reducing the difference in the display brightness of the display panel 100 at different viewing angles, and thus improving the uniformity of the display brightness of the display panel 100 at different viewing angles.

In one embodiment, referring to FIG. 9, the ratio of a to b may be satisfy $1.5 \leq a/b \leq 4$, e.g., $1.5b \leq a \leq 4b$. According to the present disclosure, the width a of the first sub-light-shielding structure 31 may be increased to improve the shielding effect of the first sub-light-shielding structure 31 on the light-emitting region Q1 in the second direction. When a is set to be larger than or equal to 1.5b, the shielding effect of the first sub-light-shielding structure 31 on the light-emitting region Q1 in the second direction may be effectively improved, thereby reducing the possibility of the light emitted from the light-emitting region Q1 entering the human eye from the left side of the first sub-light-shielding structure 31 when viewing the display panel 100 obliquely at a certain viewing angle in the observation plane along the second direction. As such, the disclosed display panel 100 may be conducive to improving the shielding effect of the first sub-light-shielding structure 31, and thus effectively reduce the display brightness of the display panel 100 at this viewing angle, and solve the high display-brightness problem of existing display panels when being viewed at this viewing angle.

Moreover, setting a>4b may cause the width of the first sub-light-shielding structure 31 to be too large, and the load from the first sub-light-shielding structure 31 may be too large. Therefore, in one embodiment, the value of a may be smaller than or equal to 4b. Setting a≤4b may ensure that the first sub-light-shielding structure 31 can provide reliable shielding for the light-emitting region Q1, and at the same time, may also be conducive to avoiding the excessive load problem caused by the first sub-shielding structure 31.

Figure 11:
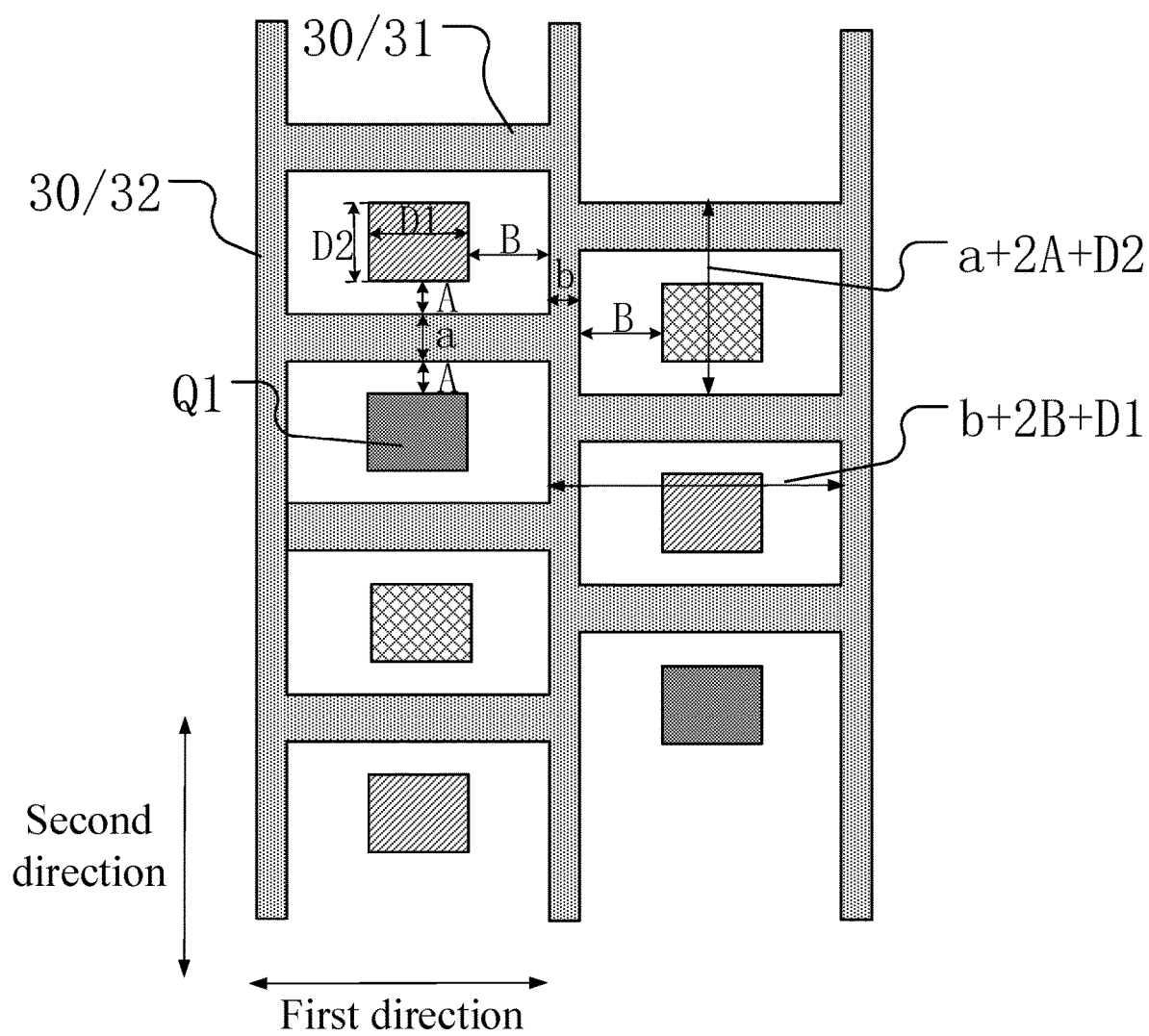
FIG. 11 illustrates a schematic diagram of another exemplary positional relationship between a plurality of sub-pixels and a light-shielding structure in a display panel according to various embodiments of the present disclosure.

FIG. 11 illustrates a schematic diagram of another exemplary positional relationship between a plurality of sub-pixels and a light-shielding structure in a display panel according to various embodiments of the present disclosure. Referring to FIG. 11, in one embodiment, the values of a, b, A, and B may satisfy a+2A<b+2B. Here, a+2A represents the distance between the light-emitting regions Q1 of two sub-pixels P that are adjacent to each other in the second direction, for example, the distance between two adjacent boundaries of the light-emitting regions Q1 of the two sub-pixels P that are adjacent to each other in the second direction, that is, the distance between adjacent light-emitting regions Q1 in the second direction. b+2B represents the distance between the light-emitting regions Q1 of two sub-pixels P that are adjacent to each other in the first direction, for example, the distance between two adjacent boundaries of the light-emitting regions Q1 of the two sub-pixels P that are adjacent to each other in the first direction, that is, the distance between adjacent light-emitting regions Q1 in the first direction. According to the present disclosure, setting the distance between adjacent light-emitting regions Q1 in the first direction (that is, the direction of the absorption axis of the polarizer 40) to be larger than the distance between adjacent light-emitting regions Q1 in the second direction, the light-shielding structure 30 may lead to that the range of the light-emitting region Q1 shielded by the light-shielding structure 30 along the absorption axis of the polarizer 40 is smaller than the range of the light-emitting region Q1 shielded by the light-shielding structure 30 along the second direction. Therefore, when the display panel 100 is viewed obliquely at a certain viewing angle in the observation plane along the absorption axis of the polarizer 40, the brightness may be improved; and when the display panel 100 is viewed obliquely at a certain viewing angle in the observation plane along the second direction, the brightness may be reduced. As such, the present disclosure may be conducive to reducing the difference in the brightness of the display panel 100 when viewing the display panel 100 at different viewing angles, and thus may be conducive to improve the uniformity of the display brightness of the display panel 100 at different viewing angles.

In one embodiment, referring to FIG. 11, in a same subpixel P, the width of the light-emitting region Q1 in the first direction may be D1; the width of the light-emitting region Q1 in the second direction may be D2; and a, b, A, B, D1, and D2 may satisfy a+2A+D2<b+2B+D1.

For example, a+2A+D2 may be regarded as the width of the repeating unit corresponding to the sub-pixel in the second direction, and b+2B+D1 may be regarded as the length of the repeating unit corresponding to the sub-pixel in the first direction. Setting the length in the first direction to be larger than the width in the second direction may be equivalent to increasing the size of the sub-pixel P in the direction of the absorption axis of the polarizer 40. As such, the disclosed display panel 100 may be conducive to increasing the first distance B between the boundary of the light-emitting region Q1 and the light-shielding structure 30 in the first direction, and at the same time, the disclosed display panel 100 may also be conducive to reducing the second distance A between the boundary of the light-emitting region Q1 and the light-shielding structure 30 in the second direction. Therefore, the disclosed display panel 100 may be beneficial to reduce the difference in the display brightness between the viewing angle in the observation plane along the absorption axis of the polarizer 40 and the viewing angle in the observation plane along the second direction intersected with the absorption axis of the polarizer 40, thereby conducive to improving the user's visual experience.

In one embodiment, referring to FIG. 11, in each sub-pixel P, along the second direction, the width a of each first sub-light-shielding structure 31 may be the same; and along the first direction, the width b of each second sub-light-shielding structure 32 may be the same.

For example, according to the present disclosure, the width of the first sub-light-shielding structure 31 in the second direction corresponding to each sub-pixel P may be set the same. In the process of manufacturing the first sub-light-shielding structures 31, the fabrication of the first sub-light-shielding structures 31 may be completed by adopting the same size, which is conducive to simplifying the manufacturing process of the first sub-light-shielding structures 31 in the display panel 100, and improving the production efficiency of the display panel 100. Similarly, the width of the second sub-light-shielding structure 32 in the first direction corresponding to each sub-pixel P may be set the same. In the process of manufacturing the second sub-light-shielding structure 32, the fabrication of the second sub-light-shielding structure 32 may be completed by adopting the same size, which is conducive to simplifying the manufacturing process of the second sub-light-shielding structure 32 in the display panel 100, and also beneficial to improve the production efficiency of the display panel 100.

In one embodiment, referring to FIG. 2, the display panel 100 may further include a touch-control layer TP. The touch-control layer TP may include touch-control lines L. The light-shielding layer Z may be multiplexed as the touch-control layer TP, and the light-shielding structure 30 may be multiplexed as the touch-control lines L.

For example, in the display panel 100 that has a touch-control function, touch control may be achieved through a touch-control layer disposed in the display panel 100. The touch-control layer may include touch-control lines, such as metal grid wires, which can form touch-control electrodes and implement the touch-control function. According to the present disclosure, the light-shielding layer Z may be multiplexed as the touch-control layer TP, and the light-shielding structure 30 may be multiplexed as the touch-control lines L, such that the light-shielding layer Z may be able to improve the uniformity of the display brightness of the display panel 100 at different viewing angles while also realizing the touch-control function. Therefore, adding another film structure to the display panel 100 as the touch-control layer TP may not be necessary, but instead the light-shielding layer Z may be multiplexed as the touch-control layer TP. Therefore, the disclosed display panel 100 may be conducive to simplifying the film structure of the display panel 100, and also conducive to simplifying the manufacturing process of the display panel 100, thus improving the production efficiency of the display panel 100.

In one embodiment, referring to FIG. 2 and FIG. 9, the light-shielding structure 30 may be multiplexed as the touch-control lines L. For example, in a same sub-pixel P, the width of the touch-control line extending along the first direction (corresponding to the first sub-light-shielding structure 31) may be a, the width of the touch-control line extending along the second direction (corresponding to the second sub-light-shielding structure 32) may be b, and the ratio of a to b may satisfy a>b. In one embodiment, $1.5 \leq a/b \leq 4$, e.g., $1.5b \leq a \leq 4b$. As such, the difference in the line width of the touch-control lines may not be too large, which is conducive to avoiding the presence of visible metal reflections on the display panel due to the excessively large line width of some touch-control lines, and also conducive to avoiding degraded touch-control sensitivity of the touch-control electrodes due to excessively large line width of the touch-control lines. Therefore, according to the present disclosure, the design of the line width of touch-control lines in the display panel may be not only conducive to reducing the problem of metal reflection in the display panel, but also conducive to improving the touch-control sensitivity of the touch-control electrodes.

Figure 12:
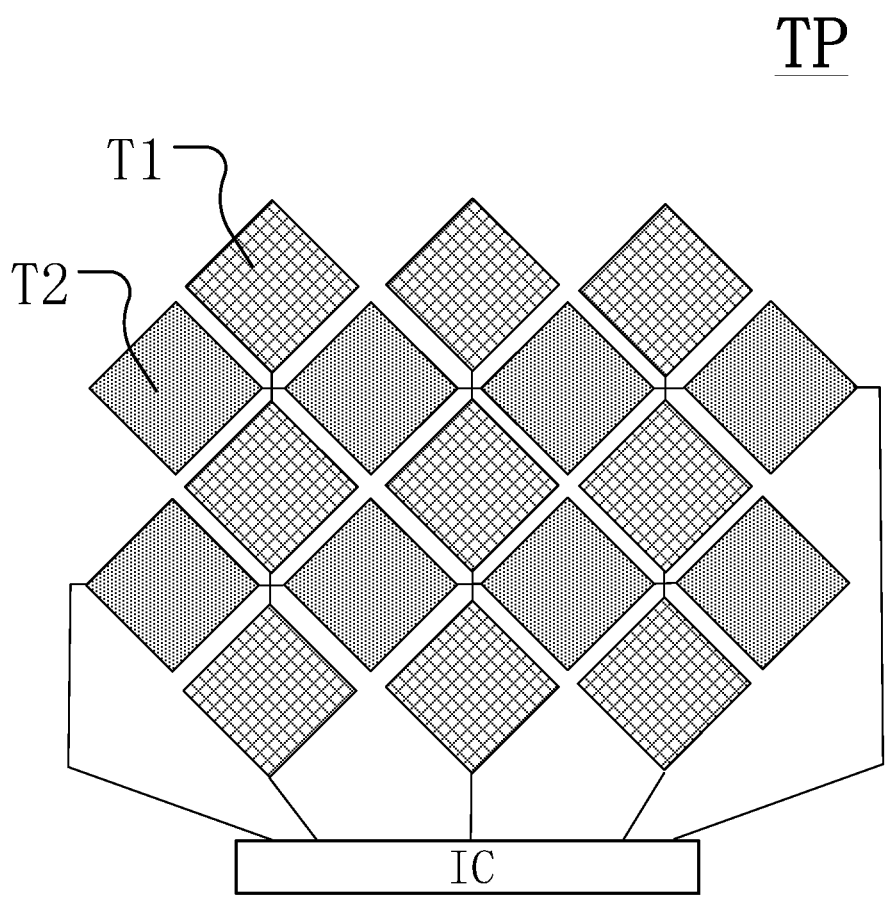
FIG. 12 illustrates a schematic diagram of an arrangement of touch-control electrodes in an exemplary display panel according to various embodiments of the present disclosure.

FIG. 12 illustrates a schematic diagram of an arrangement of touch-control electrodes in an exemplary display panel according to various embodiments of the present disclosure. Referring to FIG. 12, the touch-control layer TP may include touch-control electrodes. In FIG. 12, a plurality of mutual-capacitive touch-control electrodes are taken as examples of the touch-control electrodes for illustration. The mutual-capacitive touch-control electrodes may include a plurality of first touch-control electrodes T1, and a plurality of second touch-control electrodes T2. The plurality of first touch-control electrodes T1 and the plurality of second touch-control electrodes T2 may be electrically connected to the control chip IC, respectively.

In the touch-control detection stage, the control chip IC may send a touch-control detection signal to the first touch-control electrode T1, and a coupling capacitor may be formed between the first touch-control electrode T1 and the second touch-control electrode T2. In the touch-control sensing stage, the second touch-control electrode T2 may send a touch-control sensing signal to the control chip IC, and the change of the coupling capacitance between the first touch-control electrode T1 and the second touch-control electrode T2 may be determined through the touch-control sensing signal. When a control object touches the display panel 100, a coupling capacitance may be formed between the control object and the second touch-control electrode T2, causing the coupling capacitance between the first touch-control electrode T1 and the second touch-control T2 to change. The change of the coupling capacitance can determine the touch position, thereby realizing the touch-control function of the display panel 100. It should be noted that FIG. 12 only illustrates the mutual-capacitive touch-control electrodes, and any appropriate size and quantity of the first touch-control electrodes T1 and the second touch-control electrodes T2 may be encompassed in the present disclosure.

Figure 13:
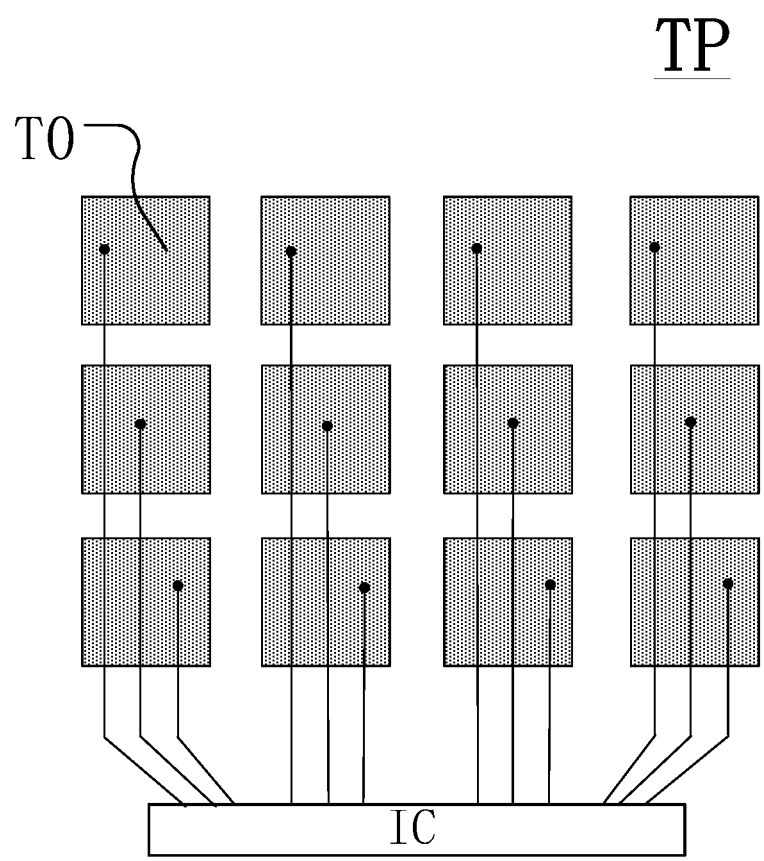
FIG. 13 illustrates a schematic diagram of another arrangement of touch-control electrodes in an exemplary display panel according to various embodiments of the present disclosure.

FIG. 13 illustrates a schematic diagram of another arrangement of touch-control electrodes in an exemplary display panel according to various embodiments of the present disclosure. In FIG. 13, a plurality of self-capacitive touch-control electrodes are taken as examples of the touch-control electrodes for illustration. When the touch-control electrodes are self-capacitive touch-control electrodes, the touch-control electrodes may include a plurality of touch-control electrode units T0, and each touch-control electrode unit T0 may be electrically connected to the control chip IC. In the touch-control detection stage, the control chip IC may send a touch-control detection signal to the touch-control electrode unit T0 through the signal line between the touch-control electrode unit T0 and the control chip IC. In the touch-control sensing stage, the touch-control electrode unit T0 may send a touch-control sensing signal to the control chip IC through the signal line between the touch-control electrode unit T0 and the control chip IC. When a control object touches the display panel, the position of the touch-control electrode experiencing a change in the coupling capacitance may be determined through the touch-control sensing signal, so as to realize the touch-control function of the display panel 100. It should be noted that FIG. 13 only illustrates the self-capacitive touch-control electrodes, and any appropriate size and quantity of the touch-control electrode unit T0 may be encompassed in the present disclosure.

Figure 14:
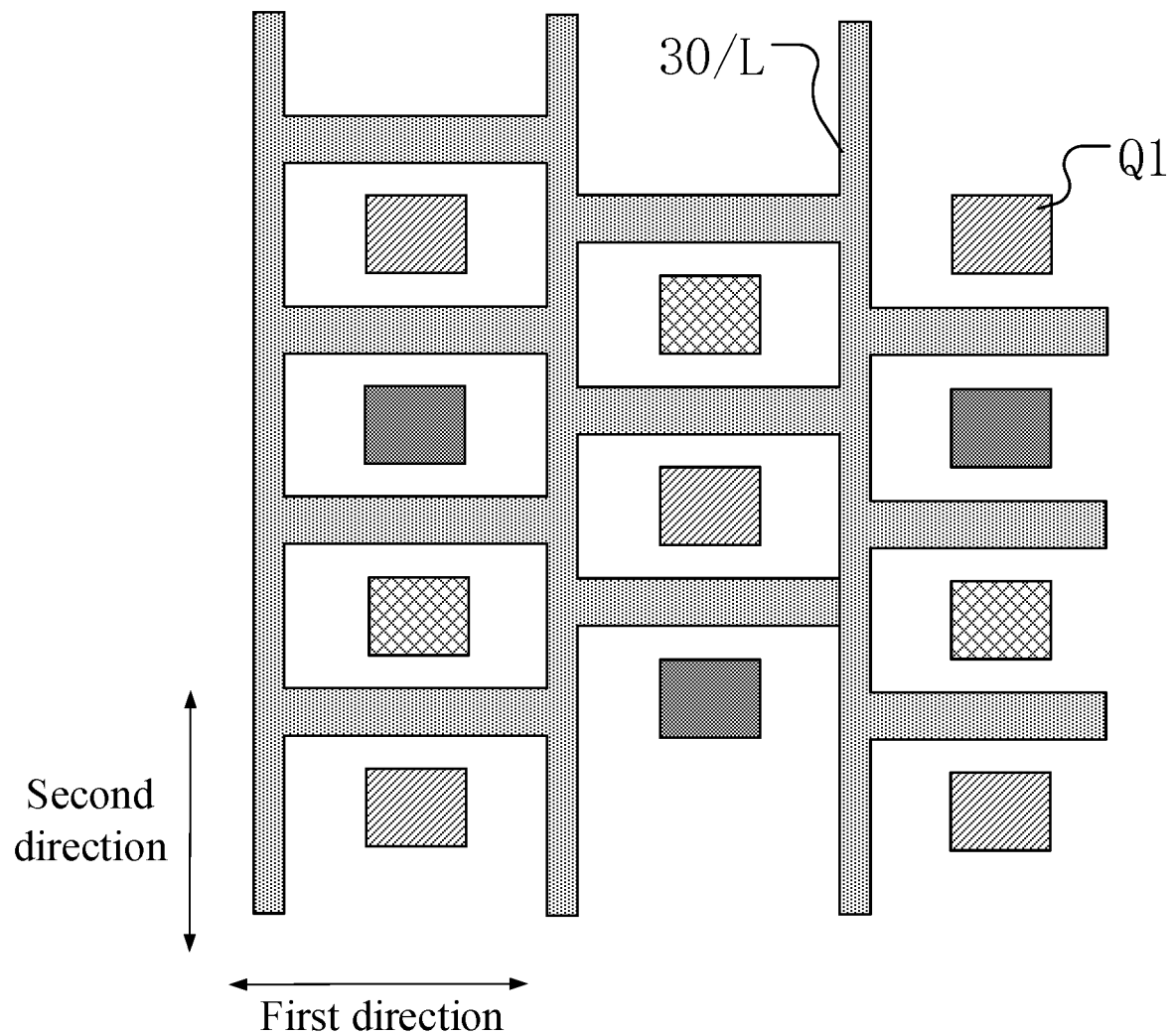
FIG. 14 illustrates a schematic diagram of an exemplary wiring scheme for touch-control lines in a display panel according to various embodiments of the present disclosure.

FIG. 14 illustrates a schematic diagram of an exemplary wiring scheme for touch-control lines in a display panel according to various embodiments of the present disclosure. Referring to FIG. 14, the non-light-emitting region Q2 between two adjacent light-emitting regions Q1 may include a touch-control line L. In one embodiment, the touch-control layer may be a mutual-capacitive touch-control layer or a self-capacitive touch-control layer.

It should be noted that FIG. 14 illustrates the arrangement of touch-control lines L in a same touch-control electrode. For example, a touch-control electrode may include a plurality of touch-control lines L shown in FIG. 14, and FIG. 14 only shows a partial enlarged view of a single touch-control electrode.

For example, when the touch-control layer is a self-capacitive or mutual-capacitive touch-control layer, the touch-control electrode may have a structure as shown in FIG. 12 or FIG. 13. In a same first touch-control electrode T1, in a same second touch-control electrode T2, or in a same touch-control electrode unit T0, the corresponding touch-control lines L may be electrically connected to each other, and only a single touch-control line L is disposed between two adjacent light-emitting regions Q1. Taking two adjacent light-emitting regions Q1 in the second direction as an example, only a single touch-control line L may be disposed between the two light-emitting regions Q1, and the display panel 100 is viewed obliquely in the observation plane along the second direction on the two opposite sides of the display panel 100, such as the directions corresponding to 90° and 270° as shown in FIG. 4. When the display panel 100 is viewed obliquely in the observation plane along the 90° direction (corresponding to the upper side of the display panel shown in FIG. 12), the touch-control lines L may be able to shield the portion of the light-emitting regions Q1 located on the upper side of the two adjacent light-emitting regions Q1; and when the display panel 100 is viewed obliquely in the observation plane along the 270° direction (corresponding to the lower side of the display panel shown in FIG. 12), the touch-control lines L may be able to shield the portion of the light-emitting regions Q1 located on the lower side of the two adjacent light-emitting regions Q1. Therefore, for the two opposite viewing angles, the same touch-control lines L may be able to respectively provide shielding for the two light-emitting regions Q1. As such, while improving the uniformity of the display brightness of the display panel 100 at different viewing angles, the design of the display panel 100 according to the present disclosure may also be beneficial to reduce the quantity of touch-control lines L in the display panel 100, thereby conducive to simplifying the complexity of the touch-control lines L and saving the production cost.

Figure 15:
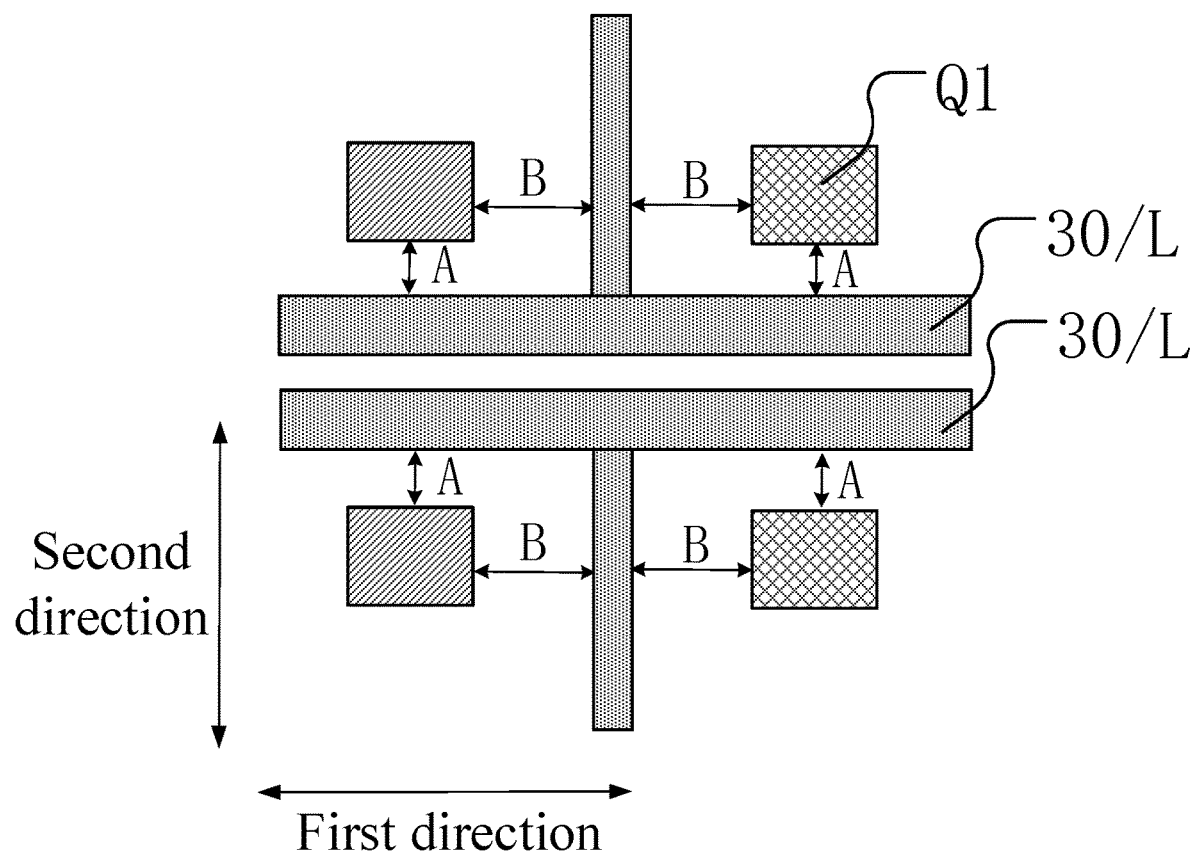
FIG. 15 illustrates a schematic diagram of another exemplary wiring scheme for touch-control lines in a display panel according to various embodiments of the present disclosure.

FIG. 15 illustrates a schematic diagram of another exemplary wiring scheme for touch-control lines in a display panel according to various embodiments of the present disclosure. Referring to FIG. 15, in one embodiment, at least one non-light-emitting region may include two touch-control lines L, the two touch-control lines L may extend in the same direction, and the two touch-control lines L may be configured to receive different touch-control signals. In one example, the touch-control layer may be a mutual-capacitive touch-control layer or a self-capacitive touch-control layer.

For example, when the touch-control layer is a self-capacitive touch-control layer, the touch-control lines L on the touch-control layer may form a plurality of independent touch-control electrode units T0, as shown in FIG. 13. It should be noted that the touch-control electrode units T0 may be formed by a plurality of touch-control lines L as shown in FIG. 15. The touch-control lines in each touch-control electrode unit T0 may be electrically connected to each other, and the plurality of touch-control electrode units T0 may be insulated from each other. At the junction of adjacent touch-control electrode units T0, the non-light-emitting region between two adjacent light-emitting regions Q1 may include two touch-control lines L, as shown in FIG. 15. The two touch-control lines may extend in a same direction. The two touch-control lines L may respectively belong to different touch-control electrode units T0 shown in FIG. 13. The two touch-control electrode units T0 may be electrically connected to the control chip IC through different signal lines. In other words, for a same touch-control electrode unit T0, the touch-control lines L therein may be electrically connected to each other, and only one touch-control line L may need to be disposed between adjacent light-emitting regions Q1; and at the junction of the two touch-control electrode units T0, since the adjacent touch-control electrode units T0 are insulated from each other, two touch-control lines L may be disposed between the two adjacent light-emitting regions Q1, and the two touch-control lines L may belong to different touch-control electrode units T0 and may be mutually insulated from each other. According to the present disclosure, the quantity of touch-control lines L between two adjacent light-emitting regions Q1 may be flexibly determined based on actual conditions.

When two touch-control lines L are disposed between two adjacent light-emitting regions Q1, the first distance B mentioned in the above embodiments may refer to the minimum distance between the touch-control line L that is closest to the boundary of the light-emitting region Q1 in the first direction and the boundary of the light-emitting region Q1, and the second distance A mentioned in the above embodiments may refer to the minimum distance between the touch-control line that is closest to the boundary of the light-emitting region Q1 in the second direction and the boundary of the light-emitting region Q1. Taking two touch-control lines L between two adjacent light-emitting regions Q1 in the second direction as an example, when the display panel 100 is viewed obliquely at a certain viewing angle in the plane along the second direction, the two touch-control lines L may respectively provide shielding for the closest portion of the light-emitting regions Q1, thereby reducing the amount of light incident to the human eye at this viewing angle, and reducing the display brightness of the display panel at the viewing angle corresponding to the second direction, which is conducive to solving the overly high display-brightness problem at the viewing angle in existing display panels.

It should be noted that when the touch-control layer is a mutual capacitive touch-control layer as shown in FIG. 12, since the first touch-control electrode T1 and the second touch-control electrode T2 are insulated from each other, in the region at the junction between the first touch-control electrode T1 and the second touch-control electrode T2, the structure between the two adjacent light-emitting regions Q1 may be arranged as that shown in FIG. 15. That is, between two touch-control lines L that are insulated from each other and arranged between adjacent light-emitting regions Q1, one touch-control line L may belong to the first touch-control electrode T1, and another touch-control line L may belong to the second touch-control electrode T2. As such, insulation isolation between the first touch-control electrode T1 and the second touch-control electrode T2 may be achieved.

Figure 16:
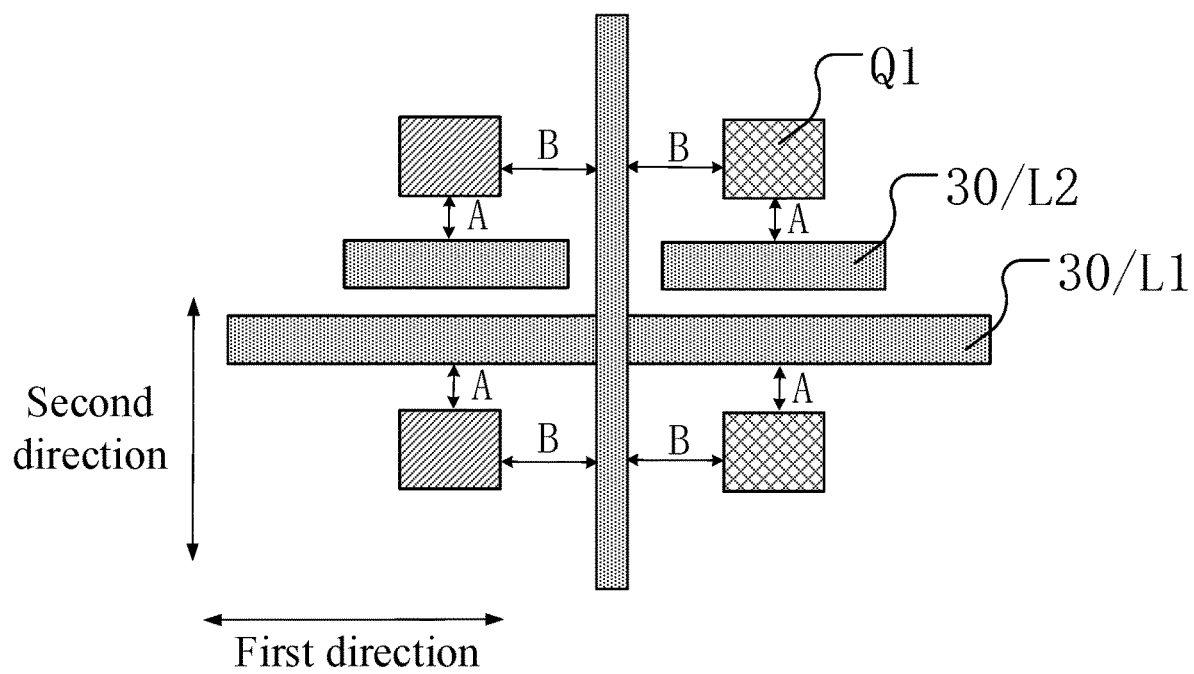
FIG. 16 illustrates a schematic diagram of an exemplary positional relationship between touch-control electrode lines and dummy electrode lines in a display panel according to various embodiments of the present disclosure.

FIG. 16 illustrates a schematic diagram of an exemplary positional relationship between touch-control electrode lines and dummy electrode lines in a display panel according to various embodiments of the present disclosure. Referring to FIG. 16, in one embodiment, the touch-control lines may include a touch-control electrode line L1 and a dummy electrode line L2, and the dummy electrode line L2 may be located between the touch-control electrode line L1 and the light-emitting region Q1.

Referring to FIG. 16, in one embodiment, a touch-control electrode line L1 and a dummy electrode line L2 may be together disposed between two adjacent light-emitting regions Q1 along the second direction, and the touch-control electrode line L1 and the dummy electrode line L2 may both extend along the first direction. Along the second direction, the minimum distance between the dummy electrode line L2 and the boundary of the adjacent light-emitting region Q1 may be a second distance A, and the minimum distance between the touch-control electrode line L1 and the boundary of the adjacent light-emitting region Q1 may be the second distance A. In the non-light-emitting region Q2 at the periphery of the same light-emitting region Q1 may further include a touch-control electrode line L1 that extends along the second direction. The minimum distance between the touch-control line L1 that extends in the second direction and the boundary of the adjacent light-emitting region Q1 may be a first distance B. In one embodiment, the values of A and B may satisfy B>A. As such, the design according to the present disclosure may be conducive to increasing the display brightness of the display panel 100 when the display panel 100 is viewed obliquely at a certain angle in the plane along the direction of the absorption axis of the polarizer 40, and also conducive to reducing the display brightness of the display panel 100 when the display panel 100 is viewed obliquely at a certain angle in the plane along the second direction. Therefore, the disclosed display panel 100 may be conducive to reducing the difference in the display brightness of the display panel at different viewing angles, and thus conducive to improving the user's visual experience.

For example, referring to FIG. 16, when two touch-control lines L are disposed between two adjacent light-emitting regions Q1, the two touch-control lines L may be a touch-control electrode line L1 and a dummy electrode line L2, respectively. The touch-control electrode line L1 may be a component of a touch-control electrode, and may be used to receive or transmit touch-control signals. Alternatively, when the touch-control layer is a self-capacitive touch-control layer as shown in FIG. 13, the touch-control electrode line L1 may be a component of the self-capacitive touch-control electrode unit T0. When the touch-control layer is a mutual-capacitive touch-control layer as shown in FIG. 12, the touch-control electrode line L1 may be a component of a first touch-control electrode T1 or a second touch-control electrode T2.

According to the present disclosure, a dummy electrode line L2 may be disposed between the touch-control electrode line L1 and the light-emitting region Q1, and the dummy electrode line L2 may also play a role in shielding light. When only one touch-control line L is disposed between two adjacent light-emitting regions Q1, along the second direction, the touch-control line L may need to provide shielding for each of the two adjacent light-shielding regions Q1, and thus the width of the touch-control line L in the second direction may be set large. When a touch-control electrode line L1 and a dummy electrode line L2 are disposed between two adjacent light-emitting regions Q1, the touch-control electrode line L1 may only need to provide light shielding for the light-emitting region Q1 adjacent to the touch-control electrode line L1, and the dummy electrode line L2 may only need to provide light shielding for the light-emitting region Q1 adjacent to the dummy electrode line L2. Therefore, the width of the touch-control electrode line L1 and the dummy electrode line L2 in the second direction may not need to be set too large, which is beneficial to avoid the problem of increasing the parasitic capacitance when the line width of the touch-control electrode line L1 is set overly large.

In one embodiment, referring to FIG. 16, the dummy electrode line L2 may be connected to a fixed voltage. When the dummy electrode line L2 is connected to a fixed voltage, the dummy electrode line L2 may be used as a signal-shielding line, thereby conducive to reducing the coupling capacitance caused by disposing the dummy electrode line L2 in the display panel 100. In one embodiment, when disposing the dummy electrode line L2 in the display panel 100, the dummy electrode line L2 may be grounded.

It should be understood that when the dummy electrode line L2 is disposed in the display panel 100 according to the present disclosure, the dummy electrode line L2 may be set as a potential floating line, that is, the dummy electrode line L2 may not receive any signal. At this time, connecting the dummy electrode line L2 to other signal lines may not be necessary. That is, arranging any other line to provide signals to the dummy electrode line L2 may not be needed, thereby conducive to reducing the wiring complexity of the display panel 100.

In one embodiment, the dummy electrode line L2 may have a segment structure as illustrated in FIG. 16. The length of the dummy electrode line L2 may be set to be smaller than the length of the touch-control electrode line L1 that is arranged in correspondence with the dummy electrode line L2. For example, referring to FIG. 16, the length of the dummy electrode line L2 along the first direction may be smaller than the length of the corresponding touch-control electrode line L1 along the first direction, thereby conducive to avoiding the possibility of accumulation of electrostatic charges on the dummy electrode line L2 caused by excessively large length of the dummy electrode line L2. As such, the disclosed design of display panel 100 may be conducive to preventing interference to the signal of the display panel 100 due to the introduction of the dummy electrode line L2.

Figure 17:
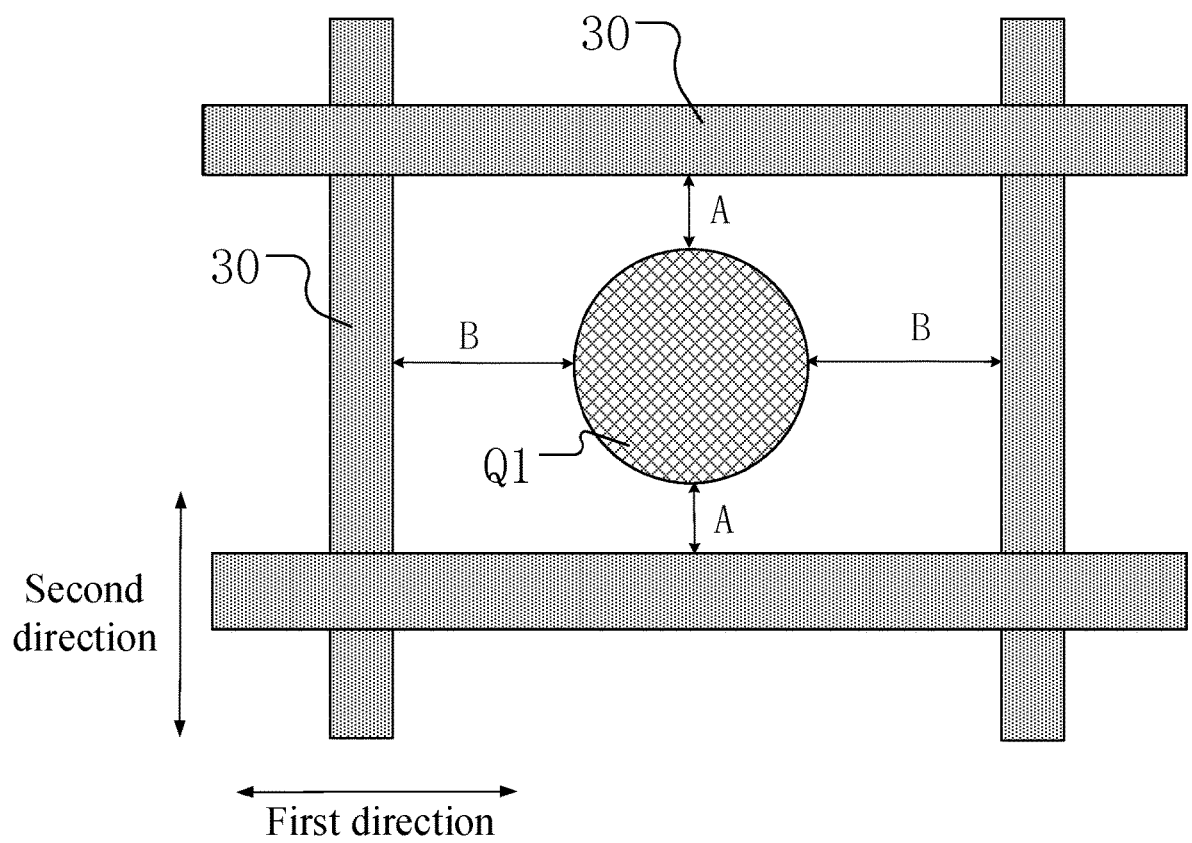
FIG. 17 illustrates a schematic diagram of another positional relationship between sub-pixels and a light-shielding layer in a display panel according to various embodiments of the present disclosure.

It should be noted that for illustrative purposes, the light-emitting region Q1 in the above embodiments is described as having a rectangular shape, and in some other embodiments, the light-emitting region Q1 may have a circular shape or any other appropriate shape. FIG. 17 illustrates a schematic diagram of another positional relationship between sub-pixels and a light-shielding layer in a display panel according to various embodiments of the present disclosure. Referring to FIG. 17, in one embodiment, the light-emitting region Q1 may have a circular shape. When the light-emitting region Q1 has a circular shape, the first distance B mentioned in the above embodiments may refer to the minimum distance between the boundary of the light-emitting region Q1 and the light-shielding structure 30 adjacent to the light-emitting region Q1 along the first direction; and the second distance A mentioned in the above embodiments may refer to the minimum distance between the boundary of the light-emitting region Q1 and the light-shielding structure 30 adjacent to the light-emitting region Q1 along the second direction.

Figure 18:
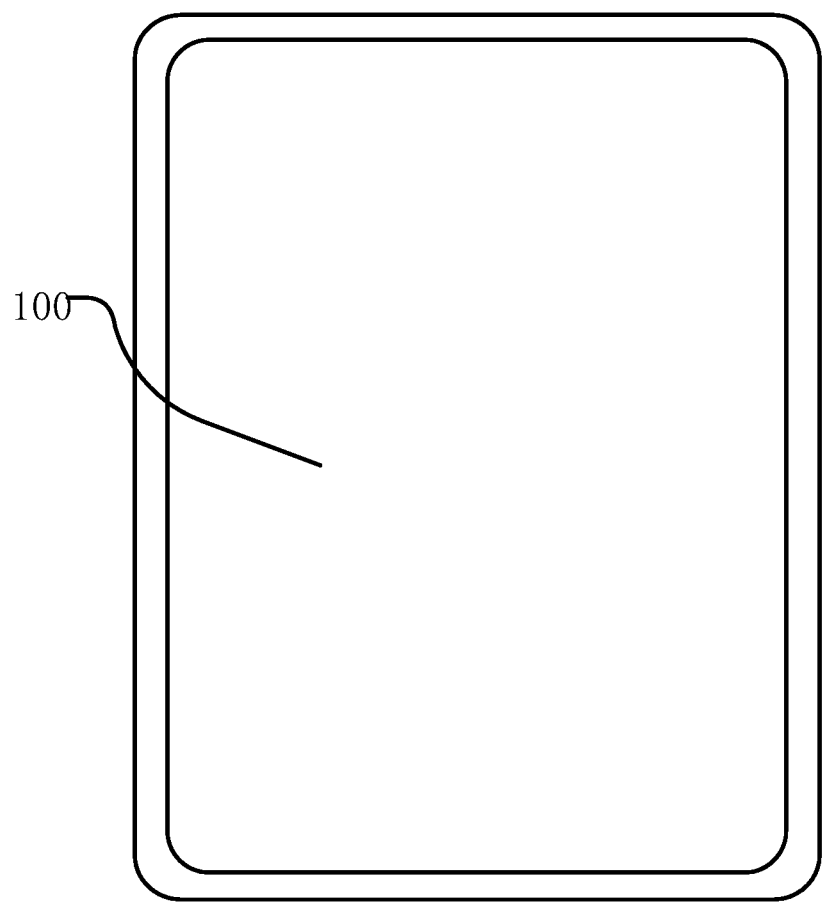
FIG. 18 illustrates a schematic structural diagram of an exemplary display device according to various embodiments of the present disclosure.

Based on the same design concept, the present disclosure also provides a display device, including any one of the display panels described in the above embodiments. FIG. 18 illustrates a schematic structural diagram of an exemplary display device according to various embodiments of the present disclosure. Referring to FIG. 18, the display device 200 may include any display panel described in the embodiments provided above. A mobile phone is shown in FIG. 18 as an example of the disclosed display device 200. It should be understood that the display device according to various embodiments of the present disclosure may be a computer, a television, a vehicle-mounted display device, or any other type of device with a display function, and the present disclosure does not limit the display device to any specific type.

The display device provided by various embodiments of the present disclosure may have the advantage effects of the display panel provided by the above embodiments of the present disclosure. For details, reference may be made to specific description of the display panel in the embodiments described above, and the present disclosure does not repeat the description herein again.

Compared to existing display panels and display devices, the disclosed display panel and display device may at least demonstrate the following exemplary advantages.

According to the disclosed display panel and display device, a light-shielding layer is disposed on the side of the light-emitting device layer away from the base substrate, a polarizer is disposed on the side of the light-shielding layer away from the base substrate, and the direction of the absorption axis of the polarizer is a first direction. That is, the light-shielding layer is disposed between the light-emitting device layer and the polarizer. When the sub-pixels in the light-emitting device layer emit light, the light-shielding layer may be able to block the light to a certain extent corresponding to different viewing angles. For example, in a same sub-pixel, along the direction of the absorption axis of the polarizer, e.g., the first direction, the minimum distance between the boundary of the light-emitting region of the sub-pixel and the light-shielding structure in the light-shielding layer is a first distance B, and along a second direction intersected with the first direction, the minimum distance between the boundary of the light-emitting region of the sub-pixel and the light-shielding structure in the light-shielding layer is a second distance A. According to the present disclosure, the values of A and B satisfy B>A. Therefore, along the direction of the absorption axis of the polarizer, the range of the sub-pixel shielded by the light-shielding structure is small, while along the second direction intersected with the absorption axis of the polarizer, the range of the sub-pixel shielded by the light-shielding structure is large. As such, when the display panel is viewed obliquely in an observation plane along the direction of the absorption axis of the polarizer, more light may be able to enter the human eye, thereby conducive to increasing the display brightness of the display panel when being viewed obliquely in the observation plane along the direction of the absorption axis of the polarizer; and when the display panel is viewed obliquely in an observation plane along the second direction that is intersected with the direction of the absorption axis of the polarizer, because the range of the sub-pixel shielded by the light-shielding structure is large, the amount of light entering the human eye at this viewing angle is reduced, thereby conducive to reducing the display brightness of the display panel when being viewed in an observation plane along the second direction intersected with the direction of the absorption axis of the polarizer. Therefore, the present disclosure reduces the difference in the display brightness between the viewing angle in the observation plane along the absorption axis of the polarizer and the viewing angle in the observation plane along the second direction intersected with the absorption axis of the polarizer, that is, conducive to reducing the difference of the display brightness when the display panel is viewed obliquely at different viewing angles. Therefore, the disclosed display panel and display device may be conducive to improving the uniformity of the display brightness when the display panel is viewed at different viewing angles, and thus conducive to improving the user experience.

The various embodiments in the present disclosure are described in a progressive manner, and each embodiment focuses on differences from other embodiments, and the same or similar parts between the various embodiments may be referred to each other.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A display panel, including a display region and a non-display region, comprising:
   a base substrate;
   a light-emitting device layer, disposed on the base substrate, wherein the light-emitting device layer includes a plurality of sub-pixels, and a sub-pixel of the plurality of sub-pixels includes light-emitting regions and a non-light-emitting region located between two adjacent light-emitting regions;
   a light-shielding layer, disposed on a side of the light-emitting device layer away from the base substrate and including a light-shielding structure, wherein the light-shielding structure is located in the non-light-emitting region; and
   a polarizer, disposed on a side of the light-shielding layer away from the base substrate and having an absorption axis in a first direction, wherein in a same sub-pixel:
      along the first direction, a minimum distance between a boundary of the light-emitting region of the sub-pixel and the light-shielding structure is a first distance B;
      along a second direction intersected with the first direction, a minimum distance between the boundary of the light-emitting region of the sub-pixel and the light-shielding structure is a second distance A; and
      the first distance B is larger than the second distance A.

2. The display panel according to claim 1, further including an encapsulation layer, disposed between the light-emitting device layer and the polarizer, wherein:
   each sub-pixel of the plurality of sub-pixels includes an anode layer; and
   in a same sub-pixel of the plurality of sub-pixels, arctan $(B/h_1)$>arcsin $(1/n)$, where $h_1$ is, in a plane defined by the first direction and a normal direction of the base substrate, a distance between a surface of the light-shielding structure on a side away from the base substrate and the anode layer, and n is a refractive index of the encapsulation layer.

3. The display panel according to claim 2, wherein:

$$0.84<B/h_1<2.$$

4. The display panel according to claim 2, wherein, in the same sub-pixel:
   arctan $(A/h_2)$<arcsin $(1/n)$, where $h_2$ is, in a plane defined by the second direction and the normal direction of the base substrate, a distance between the surface of the light-shielding structure on the side away from the base substrate and the anode layer.

5. The display panel according to claim 4, wherein:

$$h_1=h_2.$$

6. The display panel according to claim 1, wherein:

$$0.4 \leq A/B \leq 0.8.$$

7. The display panel according to claim 1, wherein:
   the plurality of sub-pixels includes first-color sub-pixels, second-color sub-pixels, and third-color sub-pixels; and
   a second distance A corresponding to the first-color sub-pixels, a second distance A corresponding to the second-color sub-pixels, and a second distance A corresponding to the third-color sub-pixels are same.

8. The display panel according to claim 1, wherein:
   the plurality of sub-pixels includes first-color sub-pixels, second-color sub-pixels, and third-color sub-pixels; and
   a first distance B corresponding to the first-color sub-pixels, a first distance B corresponding to the second-color sub-pixels, and a first distance B corresponding to the third-color sub-pixels are same.

9. The display panel according to claim 1, wherein:
   in a same sub-pixel of the plurality of sub-pixels, the light-shielding structure includes a first sub-light-shielding structure and a second sub-light-shielding structure, wherein:
      the first sub-light-shielding structure extends along the first direction;

the second sub-light-shielding structure extends along the second direction;

the first distance B is a minimum distance between the second sub-light-shielding structure and the boundary of the light-emitting region; and the second distance A is a minimum distance between the first sub-light-shielding structure and the boundary of the light-emitting region.

10. The display panel according to claim 9, wherein:

along the second direction, a width of the first sub-light-shielding structure is a; and along the first direction, a width of the second sub-light-shielding structure is b, wherein:

$a>b$.

11. The display panel according to claim 10, wherein:

$1.5 \leq a/b < 4$.

12. The display panel according to claim 10, wherein:

$a+2A<b+2B$.

13. The display panel according to claim 10, wherein, in the same sub-pixel:

along the first direction, a width of the light-emitting region is D1; and along the second direction, a length of the light-emitting region is D2, wherein:

$a+2A+D2<b+2B+D1$.

14. The display panel according to claim 9, wherein, in each sub-pixel of the plurality of sub-pixels:

along the second direction, first sub-light-shielding structures in the plurality of sub-pixels have a same width; and along the first direction, second sub-light-shielding structures in the plurality of sub-pixels have a same width.

15. The display panel according to claim 1, further including a touch-control layer, wherein:

the touch-control layer includes touch-control lines;

the light-shielding layer is multiplexed as the touch-control layer; and the light-shielding structure is multiplexed as the touch-control lines.

16. The display panel according to claim 15, wherein:

each non-light-emitting region in the plurality of sub-pixels located between two adjacent light-emitting regions includes a touch-control line.

17. The display panel according to claim 15, wherein:

at least one non-light-emitting region in the plurality of sub-pixels includes two touch-control lines, wherein:

the two touch-control lines extend along a same direction, and the two touch-control lines are configured to receive different touch-control signals.

18. The display panel according to claim 15, wherein:

the touch-control lines include touch-control electrode lines and dummy electrode lines, wherein:

each dummy electrode line is located between a touch-control electrode line and a light-emitting region.

19. The display panel according to claim 18, wherein:

the dummy electrode lines are connected to a fixed voltage.

20. A display device, including a display panel, wherein the display panel includes a display region and a non-display region and comprises:

a base substrate;

a light-emitting device layer, disposed on the base substrate, wherein the light-emitting device layer includes a plurality of sub-pixels, and a sub-pixel of the plurality of sub-pixels includes light-emitting regions and a non-light-emitting region located between two adjacent light-emitting regions;

a light-shielding layer, disposed on a side of the light-emitting device layer away from the base substrate and including a light-shielding structure, wherein the light-shielding structure is located in the non-light-emitting region; and a polarizer, disposed on a side of the light-shielding layer away from the base substrate and having an absorption axis in a first direction, wherein in a same sub-pixel:

along the first direction, a minimum distance between a boundary of the light-emitting region of the sub-pixel and the light-shielding structure is a first distance B;

along a second direction intersected with the first direction, a minimum distance between the boundary of the light-emitting region of the sub-pixel and the light-shielding structure is a second distance A; and the first distance B is larger than the second distance A.

* * * * *